(12) United States Patent
Nishikawa et al.

(10) Patent No.: US 8,585,998 B2
(45) Date of Patent: Nov. 19, 2013

(54) METHOD FOR PRODUCING GRAPHITE FILM, AND GRAPHITE FILM PRODUCED BY THE METHOD

(75) Inventors: Yasushi Nishikawa, Takatsuki (JP);
Shuhei Wakahara, Settsu (JP);
Mutsuaki Murakami, Settsu (JP)

(73) Assignee: Kaneka Corporation, Osaka-Shi (JP)

( * ) Notice: Subject to any disclaimer, the term of this patent is extended or adjusted under 35 U.S.C. 154(b) by 915 days.

(21) Appl. No.: 11/629,432

(22) PCT Filed: Jun. 9, 2005

(86) PCT No.: PCT/JP2005/010587
§ 371 (c)(1),
(2), (4) Date: Dec. 13, 2006

(87) PCT Pub. No.: WO2005/123582
PCT Pub. Date: Dec. 29, 2005

(65) Prior Publication Data
US 2008/0050305 A1    Feb. 28, 2008

(30) Foreign Application Priority Data

Jun. 16, 2004 (JP) ................................. 2004-178263
Dec. 8, 2004 (JP) ................................. 2004-355756

(51) Int. Cl.
*C01B 31/04* (2006.01)

(52) U.S. Cl.
USPC ........................................................ 423/448

(58) Field of Classification Search
USPC ........................................................ 423/448
See application file for complete search history.

(56) References Cited

U.S. PATENT DOCUMENTS

| 1,357,290 | A | * | 11/1920 | Kemmer | 423/448 |
| 4,599,193 | A | * | 7/1986 | Murase et al. | 252/511 |
| 4,645,713 | A | * | 2/1987 | Shioya et al. | 428/457 |
| 4,915,984 | A | * | 4/1990 | Murakami | 427/113 |
| 6,027,807 | A | | 2/2000 | Inoue et al. | |
| 2007/0032589 | A1 | * | 2/2007 | Nishikawa et al. | 524/495 |

FOREIGN PATENT DOCUMENTS

| JP | 60-181129 A | 9/1985 |
| JP | 61-275116 A | 12/1986 |
| JP | 02-026819 A | 1/1990 |
| JP | 05-078111 A | 3/1993 |

(Continued)

OTHER PUBLICATIONS

Machine Translation of JP 2004-269319 to Taomoto, et al.*

(Continued)

*Primary Examiner* — Daniel C McCracken
(74) *Attorney, Agent, or Firm* — Nixon & Vanderhye, PC

(57) ABSTRACT

A graphite film excelling in heat conductivity, especially, a graphite film of high heat conductivity that even when its thickness is large, would not suffer damage by heat treatment. There is provided a process for producing a graphite film, including graphitizing a raw material film of a polymer film and/or carbonized polymer film, characterized by including (i) holding the raw film in a vessel capable of direct passage of current through voltage application and (ii) applying voltage to the vessel to thereby induce electrification so that graphitization is carried out. There is further provided a process for producing a graphite film, characterized by including the step of holding the raw material film in vessel (A) being electrifiable, subsequently holding the resultant vessel (A) in vessel (B) being electrifiable and effecting current passage through the whole so that graphitization is carried out.

23 Claims, 6 Drawing Sheets

(56) References Cited

FOREIGN PATENT DOCUMENTS

| | | | |
|---|---|---|---|
| JP | A-07-109171 | | 4/1995 |
| JP | A-08-267647 | | 10/1996 |
| JP | 09-156913 A | | 6/1997 |
| JP | A-2001-79977 | | 3/2001 |
| JP | A-2003-165714 | | 6/2003 |
| JP | 2004-123506 | | 4/2004 |
| JP | 2004-269319 | * | 9/2004 |
| WO | WO 2005/023713 | * | 3/2005 |

OTHER PUBLICATIONS

"Definition of electrifiable," accessed online at <http://www.merriam-webster.com/dictionary/electrifiable> on Jul. 26, 2012.*

"Definition of electrifiable," accessed online at <http://www.webster-dictionary.org/definition/electrifiable> on Jul. 26, 2012.*

"Definition of electrification," accessed online at <http://www.merriam-webster.com/dictionary/electrification> on Jul. 26, 2012.*

"Definition of electrifying," accessed online at <http://www.merriam-webster.com/dictionary/electrifying?show=0&t=1343309163> on Jul. 26, 2012.*

Taomoto, Akira, "Super Graphite Sheet with Flexibility and High Thermal Conductivity," Material Report R&D, 1999, vol. 19, No. 11, 7 pages.

International Search Report from Corresponding International Application No. PCT/JP2005/010587, dated Sep. 20, 2005, 3 pages.

International Preliminary Report on Patentability (Chapter I of the Patent Cooperation Treaty) from Corresponding International Application No. PCT/JP2005/010587, dated Dec. 20, 2006, 6 pages.

Taomoto, Akira; "*Super Graphite Sheet with Flexibility and High Thermal Conductivity*", Functional Materials vol. 19, No. 11, Nov. 1999, pp. 27-33.

Hoshi Toshihara et al., "Super Graphite", National Technical Report, vol. 40, No. 1, Feb. 1994, pp. 74-80.

Hoshi, Toshihara et al., "*Newly Highly Oriented Graphite Crystals for Radiation Optics*", Synchrotron Radiation, vol. 6, No. 3, 1993, pp. 43-50.

* cited by examiner

METHOD FOR PRODUCING GRAPHITE FILM, AND GRAPHITE FILM PRODUCED BY THE METHOD

RELATED APPLICATIONS

This application is a nationalization of PCT application PCT/JP2005/010587 filed on Jun. 9, 2005, claiming priority based on Japanese Application No. 178263/2004 filed on Jun. 16, 2004 and Japanese Application No. 355756/2004 filed on Dec. 8, 2004, the contents of which are incorporated herein by reference in their entirety.

TECHNICAL FIELD

The present invention relates to (i) a method for producing a graphite film used as a heat radiation film, and (ii) a graphite film produced by using the method.

BACKGROUND ART

A polymer thermolysis method (Patent Citations 1 and 2) is known as a method for obtaining a graphite film excellent in electric conductivity and heat conductivity. In the polymer thermolysis method, a heating treatment is given to a polymeric film under (i) an inert atmosphere such as argon or helium, and/or (ii) reduced pressure. An example of such a polymeric film is a film made of polyoxadiazole, polyimide, polyphenylenevinylene, polybenzimidazole, polybenzoxazole, polythiazole, polyamide, or the like.

Meanwhile, a method (described in Patent citation 3) is known as a mass-production method for producing, with high productivity, a large volume of graphite for use in a shaft bearing, a seal, a melting pot, a heating element, and the like. In the method, a mixture of (i) carbon-source powder as coax, from which carbon is obtained and (ii) a caking additive such as tar pitch is sintered, and then the sintered substance, i.e., the mixture thus sintered, is electrified and heated, with the result that graphite is obtained. The electric conductivity and heat conductivity of the graphite thus produced are inferior to those of the graphite produced by using the polymer thermolysis method.

Patent Citation 1: Japanese Unexamined Patent Application Publication Tokukaisho 60-181129
Patent Citation 2: Japanese Unexamined Patent Application Publication Tokukaihei 61-275116
Patent Citation 3: Japanese Unexamined Patent Application Publication Tokukaihei 5-78111

However, the heat conductivity of such conventional graphite obtained by heating a polymeric film under an inert atmosphere and/or reduced pressure was found to be insufficient, so that the graphite was insufficient as a heat radiation material for use in a recent electronic device emitting a drastically large amount of heat.

For a better heat radiating property, the thickness of the graphite may be thicker to attain a greater heat transport. However, in the conventional polymer thermolysis method, damage to the film is easily caused. Even if the film was produced without damage, graphite thus obtained would have a low heat conductivity. A reason of this is as follows. In the polymer thermolysis method in which the heating is carried out under the inert atmosphere, the raw material film is heated from its surface, so that graphitization progressed unevenly between the inside of the film and the surface thereof. As a result, the film attains merely a low overall heat conductivity.

On the other hand, in the polymer thermolysis method in which the heating is carried out under the reduced pressure, the raw material film was heated by (i) heat conducted via a contact portion thereof with a heater and (ii) radiant heat from a heater. However, with such heating, the raw material film is heated unevenly, so that graphitization progressed unevenly. This results in a low heat conductivity of the film.

Further, due to the graphitization progressing from the surface of the raw material film, it is difficult for decomposition gas to get out from the inside of the raw material film, especially in cases where the raw material film is a thick one. The decomposition gas emitted out therefrom with such difficulty causes damages to the film. Even in cases where the film was not broken, graphitization does not progress sufficiently in the inside of the film as compared with that in a thin film. Thus, the film has a heat conductivity much inferior to that of the thin film.

Meanwhile, in the conventional method for obtaining graphite by electrifying and heating a sintered substance made from a carbon-source powder and a caking additive, the sintered substance is used as a raw material. The electric conductivity of the sintered substance is uneven, so that a current unevenly flew in the sintered substance. Accordingly, temperature rose locally therein, with the result that the sintered substance is graphitized unevenly and therefore is cracked and broken with ease. Therefore, the graphite thus obtained by using this conventional method has heat conductivity and electric conductivity much inferior to those of the graphite film obtained by heating the polymeric film.

Further, in production of a plurality of sintered substances, displacement of sintered substances likely occur during heating. Such displacement would deteriorate properties thereof. Proposed to prevent the deterioration of the properties is such a method that the sintered substances are adhered by an adhesive agent and then are electrified and heated. With this, graphite having no crack can be obtained but the graphite has much inferior heat conductivity and electric conductivity.

Moreover, when the method of fixing raw material films with an adhesive agent is adopted for acquirement of graphite in the form of a plurality of films, the adhesive agent causes deterioration of quality of the graphite. Thus, the method is not preferable.

DISCLOSURE OF INVENTION

Technical Problem

To obtain a graphite film excellent in heat conductivity, especially, a graphite film having a high heat conductivity, which is prepared without a damage due to heat treatment even though it has a thick thickness.

Technical Solution

A first invention is a method for producing a graphite film by graphitizing a raw material film, which is a polymer film and/or a polymer film that is carbonated, the method including: holding the raw material film in a vessel capable of being electrified by voltage application; and graphitizing the raw material film in the vessel by applying a voltage on the vessel so as to carry out electrification.

A second invention is the method as set forth in Claim 1, wherein: the raw material film is an insulator in an initial stage of a process of producing the graphite film.

A third invention is the method as set forth in Claims 1 or 2, wherein: the vessel is made of graphite.

A fourth invention is the method as set forth in Claim 3, wherein: the electrification is carried out in such a manner that carbon powder is filled in a gap between the vessel made of graphite and the raw material film, and/or around the vessel.

A fifth invention is a method for producing a graphite film by graphitizing a raw material film, which is a polymer film and/or a polymer film that is carbonated, the method including: holding the raw material film in a vessel (A) capable of being electrified; holding the vessel (A) in a vessel (B) capable of being electrified; and graphitizing the raw material film by electrifying the raw material film, the vessel (A), and the vessel (B), as a whole.

A seventh invention is the method as set forth in Claim 5 or 6, wherein: the electrification is carried out in such a manner that carbon powder is provided between the vessels (A) and (B).

A seventh invention is the method as set forth in Claim 5 or 6, wherein: the electrification is carried out in such a manner that carbon powder is provided between the electrifiable vessels (A) and (B).

An eighth invention is the method as set forth in any one of Claims 5 to 7, wherein: the vessels (A) and (B) are separated from each other.

A ninth invention is the method as set forth in any one of Claims 5 to 8, wherein: the vessel (B) has a cylinder shape.

A tenth invention is the method as set forth in any one of Claims 5 to 9, wherein: a straight line which indicates a direction in which the raw material film is electrified makes an angle of more than 0 degree but less than 180 degrees with a normal line with respect to an in-plane direction of the raw material film.

An eleventh invention is the method as set forth in any one of Claims 5 to 10, wherein: the vessel (A) and/or the vessel (B) is made of graphite.

A twelfth invention is the method as set forth in any one of Claims 5 to 11, wherein: the raw material film is an insulator in an initial stage of a process of producing the graphite film.

A thirteenth invention is the method as set forth in any one of Claims 1 to 12, wherein: the polymer film is made of at least one polymer selected from the group consisting of polyimide, polyamide, polyoxadiazole, polybenzothiazole, polybenzobisthiazole, polybenzoxazole, polybenzbisoxazole, polyparaphenylenevinylene, polybenzimidazole, polybenzbisimidazole, and polythiazole.

A fourteenth invention is the method as set forth in Claim 13, wherein: the polymer film is a polyimide film having a birefringence of 0.08 or more.

A fifteenth invention is the method as set forth in Claim 13, wherein: the polymer film is a polyimide film having a birefringence of 0.12 or more.

A sixteenth invention is the method as set forth in any one of Claims 13 to 15, wherein: preparation of the polyimide film includes imidating a polyamide acid containing pyromellitic dianhydride and p-phenylene diamine by using a dehydrator and an imidation promoter.

A seventeenth invention is the method as set forth in any one of Claims 13 to 16, wherein: preparation of the polyimide film includes: synthesizing a prepolymer from a diamine and an acid dianhydride, the prepolymer having the acid dianhydride on each terminal; reacting the prepolymer with another diamine so as to synthesize a polyamide acid; and imidating the polyamide acid.

An eighteenth invention is a graphite film prepared by the method as set forth in any one of Claims 1 to 17.

A nineteenth invention is a graphite film prepared by the method as set forth in any one of Claims 1 to 17, wherein a raw material film is 25 cm$^2$ or more, a heat diffusivity in in-plane directions is $5 \times 10^{-4}$ m$^2$/S or more, and a variance of the heat diffusivity in in-plane directions is 40% or less.

A twentieth invention is the graphite film as set forth in Claim 19 having a thickness of 90 μm or more.

Advantageous Effect

In the conventional method in which a sintered product prepared from a carbon-source powder and a caking additive is heated by electrification so as to graphitize the sintered product, the sintered product has an electric conductivity that is not uniform. This causes the sintered product to be heated unevenly. Thereby, the conventional method cannot attain a graphite film of a high quality. On the other hand, the present invention can provide a graphite film of a high quality as explained below.

The present invention, which does not adopt the conventional atmospheric heating or heating under reduced pressure, includes the step of holding the raw material film in a vessel capable of being electrified by voltage application; and graphitizing the raw material film in the vessel by applying a voltage on the vessel so as to carry out electrification. This results in voltage application on and electrification of the raw material film thereby causing heat generation of the raw material film. As a result, an electric resistance is lowered as the raw material film is carbonated. As the electric resistance is lowered, a current flows through the raw material film. Due to the resultant Joule heat, heat is generated in the raw material per se. As a result, an inside and a surface portion of the film are uniformly heated. The vessel also heats the film from film's surrounding sufficiently and uniformly. Therefore, the present invention makes it possible to provide a graphite that is more excellent in electric conductivity and heat conductivity.

Even with a raw material film of the order of 225 μm in thickness, which is thicker than in the conventional art, the film is heated from the inside, surface portion, and the surroundings thereof in the present invention. Thus, the surface portion and the inside of the film are graphitized substantially simultaneously. A graphite layer, which will prevent generation of decomposition gas, will not be formed in the surface layer. This makes it easy for the decomposition gas to escape from the inside of the film. Thus, the film will not be damaged by the decomposition gas. Therefore, the present invention can provide a thick graphite film that is excellent in the electric conductivity and heat conductivity.

Moreover, especially by using a polyimide film, particularly, a polyimide film of the production method according to the present invention and/or, a polyimide film that is designed to have molecules that are highly aligned with easy to have a specific birefringence, it is possible to attain a graphite film that is more excellent in the electric conductivity and heat conductivity than the conventional art.

The present invention may be arranged such that a plurality of the vessels (A) in which a raw material film is held are held in a vessel (B) capable of being electrified and they are electrified as a whole. With this arrangement, the graphite films produced in the vessels (A) will have a quality uniformly.

BRIEF DESCRIPTION OF DRAWINGS

(FIG. 10 illustrates that the vessel (B) of FIG. 9 is to have a lid thereon actually.)

EXPLANATION ON REFERENCE

Figure 1:
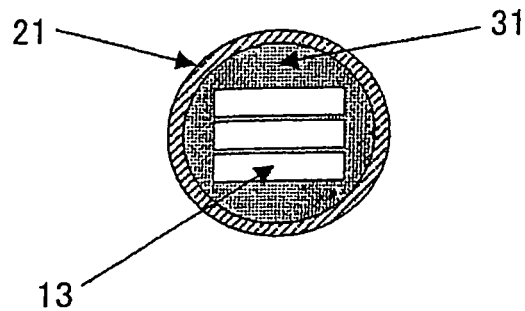
FIG. 1 illustrates how to hold vessels (A) in a vessel (B).

1 Polyimide film
2 Wedge-shaped sheet
3 Width of wedge-shaped sheet
4 Sodium light
5 Interference fringes
11 Flat and electrifiable plate for holding raw material film
12 Vessel (A)
13 Vessel (A) holding raw material film therein
21 Vessel (B) in cylinder shape
22 Vessel (B) in rectangular-tube shape
23 Lid
31 Carbon powder filled between vessel (A) and vessel (B)
32 Carbon powder filled around vessel (B)

BEST MODE FOR CARRYING OUT THE INVENTION

A first method according to the present invention is a method for producing a graphite film by graphitizing a raw material film, which is a polymer film and/or a polymer film that is carbonated. The method includes: holding the raw material film in a vessel capable of being electrified by voltage application; and graphitizing the raw material film in the vessel by applying a voltage on the vessel so as to carry out electrification.

A second method according to the present invention is a method for producing a graphite film by graphitizing a raw material film, which is a polymer film and/or a polymer film that is carbonated. The method includes: holding the raw material film in a vessel (A) capable of being electrified; holding the vessel (A) in a vessel (B) capable of being electrified; and graphitizing the raw material film by electrifying the raw material film, the electrifiable vessel (A), and the electrifiable vessel (B), as a whole.

<Graphite Film>

A graphite film produced by using the above producing methods of the present invention has a high heat conductivity, so that the graphite film is suitable as a heat radiation material for use in (i) electronic devices such as a server, a personal computer used as a server, and a desktop personal computer; (ii) portable electronic devices such as a laptop personal computer, an electronic dictionary, a PDA (Personal Digital Assistant), a mobile phone, and a portable music player; and the like.

<Raw Material Film>

A raw material film that can be used in the present invention is a polymeric film and/or a carbonized polymeric film.

<Polymeric Film>

The polymeric film that can be used in the present invention is not particularly limited; however, it is preferable that the polymeric film be a heat-resistant aromatic polymeric film containing at least one of polyimide (PI), polyamide (PA), polyoxadiazole (POD), polybenzothiazole (PBT), polybenzobisthiazole (PBBT), polybenzoxazole (PBO), polybenzbisoxazole (PBBO), polyparaphenylenevinylene (PPV), polyphenylenebenzimidazole (PBI), polyphenylenebenzbisimidazole (PPBI), and polythiazole (PT). The use of such a polymeric film allows a final product graphite to have high electric conductivity and high heat conductivity. The polymeric film may be produced by using a publicly known producing method. Among these materials, polyimide is preferable because the final product graphite is allowed to have various types of structure and property by selecting a raw material monomer of the polyimide in various ways.

<Carbonized Polymeric Film>

The carbonized polymeric film that can be used in the present invention is obtained by preheating a polymeric film, which is a starting material, under reduced pressure or an inert gas. The preheating is usually carried out at a temperature of approximately 1000° C. For example, it is preferable that the polymeric film be heated at a temperature of approximately 1000° C. for 30 minutes when the temperature is caused to rise at 10° C./minute.

<The First Method of the Present Invention: Graphitizing a Raw Material Film by Electrifying an Electrifiable Vessel Holding the Raw Material Film>

The first method of the present invention for producing a graphite film includes the step of (i) holding a raw material film, which is made of a polymeric film and/or a carbonized polymeric film, in a below-described "vessel that is directly electrifiable by applying a voltage thereto", and (ii) electrifying the electrifiable vessel and the raw material film in a below-described manner, so as to graphitize the raw material film.

Roughly speaking, this first method of the present invention can be classified into the following three methods (I) through (III) according to the raw material film to be used:

(I) A method including a step of (i) holding a "carbonized polymeric film" in a below-described "vessel that is directly electrifiable by applying a voltage thereto" and (ii) electrifying the vessel by applying a voltage thereto, so as to graphitize the carbonized polymeric film;

(II) A method, including a step of (i) obtaining a "carbonized polymeric film" by preheating a "polymeric film", (ii) holding the carbonized polymeric film in the below-described "vessel that is directly electrifiable by applying a voltage thereto", and (iii) electrifying the vessel by applying a voltage thereto, so as to graphitize the carbonized polymeric film; and (III) A method, including a step of (i) holding an insulative "polymeric film" in the below-described "vessel that is capable of being electrified by applying a voltage thereto", and (ii) electrifying the vessel by applying a voltage thereto, so as to graphitize the insulative polymeric film.

The following specifically explains these methods (I) through (III).

In the method (I), the carbonized polymeric film is used as a raw material, and is held in the vessel that can be directly electrified by applying a voltage thereto. For graphitization of the carbonized polymeric film, the vessel is electrified by applying a voltage thereto, with the result that the carbonized polymeric film is heated by the following two means: (1) heat directly conducted from the heated vessel and (2) heat generated from the carbonized polymeric film. Accordingly, a graphite film with excellent quality is obtained. Details thereof will be explained as follows.

In the conventional heating treatment carried out under a normal atmosphere and under reduced pressure, a film is heated by (i) heat conduction by an ambient gas and/or (ii) radiant heat from a heater. Thus, the type of heating the film is basically only one: heat conduction from a surface of the film to inside thereof.

In contrast, in the method of the present invention, two surfaces of the carbonized polymeric film make contact with electric conductors (the vessel (may be a graphite vessel) and/or carbon powder), so that Joule heat generated by voltage application conducts immediately from both the surfaces of the carbonized polymeric film. Accordingly, carbonization progresses from both the surfaces of the carbonized polymeric film. With this, the carbonized polymeric film is heated sufficiently up to its inside by (i) direct heat conduction from the heated vessel and (ii) heat generated by the carbonized polymeric film, thus being heated evenly in the surfaces of the carbonized polymeric film and the inside thereof.

In the present invention, heat is generated by electrifying the vessel through voltage application thereto.

Further, the starting material is the polymeric film that has been already carbonized, so that a current flows therethrough according to electric resistance change caused according to the progress of the carbonization. As the graphitization progresses, the electric resistance of the carbonized polymeric film becomes lower, so that a greater amount of current flows therethrough. As a result, the carbonized polymeric film generates heat. The current flows both in each surface and inside of the carbonized polymeric film, so that the heat is generated simultaneously in the surface and inside of the carbonized polymeric film. This results in uniform graphitization of the carbonized polymeric film.

Further, the current flows according to the electric resistance change caused according to the progress of the carbonization, and the electric resistance of the carbonized polymeric film becomes lower as the graphitization progresses, so that an amount of the current flowing in the film is increased. This causes an increase in the amount of heat generated in the carbonized polymeric film, with the result that the graphitization progresses with ease. Even if a part of the carbonized polymeric film generates heat greater than heat generated by the other parts, the heat conductivity of the film is improved as heat generation in the entire film and the graphitization therein progress, so that the heat is conducted to the entire film. Thus, the film is heated evenly.

A carbonized polymeric film before becoming graphite tends to have a heat conductivity inferior to that of graphite. In the conventional heating treatment carried out under a normal atmosphere and reduced pressure, there is only one type of heating the carbonized polymeric film. Therefore, it is difficult for heat to be sufficiently conducted to inside of the carbonized polymeric film. Accordingly, graphitization is likely to progress differently in a surface of the carbonized polymeric film and the inside thereof, with the result that only the surface of the carbonized polymeric film tends to be graphitized and inside thereof tends to be insufficiently graphitized. Therefore, the conventional method has a problem in that, when a film was heated at a high temperature, such a portion insufficiently graphitized in the film was foamed and burst, with the result that the film was heavily broken.

In contrast, in the method of the present invention, the vessel generates heat in response to voltage application thereto, and the film itself generates heat due to the current flowing through the carbonized portion of the carbonized polymeric film according to the electric resistance change as a result of the progress of the carbonization and graphitization. As such, the film is sufficiently heated by the two types of heating: (1) the direct heat conduction from the heated vessel and (2) the heat generated by the film. Accordingly, the heat is sufficiently conducted to even an inside portion having a poor heat conductivity. Therefore, graphitization never occurs only in the surface of the film, but progresses simultaneously in the surface and inside thereof.

Further, the electric conductivity becomes high in the surface of the film uniformly, so that electric fields are not concentrated in a certain portion of the film. With this, local heat generation never occurs. As a result, graphitization progresses evenly in the surface and inside of the film. Further, a portion graphitized through the heating has excellent crystallinity and excellent heat resistance. Therefore, the graphite has such a high quality that even when electric fields are concentrated in a certain portion thereof and cause generation of heat locally, the film is never broken.

In the meanwhile, in the aforementioned method (II), the insulative polymeric film is used as the raw material film. The polymeric film is preheated under an inert gas atmosphere and/or reduced pressure, with the result that the polymeric film is carbonized. The carbonized polymeric film thus prepared can be graphitized exactly the same way as the method (I) described above.

In the meanwhile, in the aforementioned method (III), the insulative polymeric film is used as the raw material film. In this case, a carbonization process for obtaining graphite is carried out in such a manner that the electrification is performed from the beginning of the carbonization process. Therefore the carbonization is likely to occur evenly. Further, according to the producing method of the present invention, two surfaces of the insulative polymeric film make contact with conductors (graphite vessel and/or carbon powder). Therefore, even though the raw material film is the insulative polymeric film, Joule heat generated in response to voltage application immediately conducts from both the surfaces of the insulative polymeric film. Therefore, carbonization progresses from both the surfaces of the insulative polymeric film.

As such, in the present invention, the surfaces of the insulative polymeric film make contact with the conductors. Therefore, during the heating of the insulative polymeric film by electrification using voltage application, carbonization progresses from the surfaces of the insulative polymeric film to the inside thereof. As the carbonization progresses to the inside, the electric resistance of the insulative polymeric film is changed. According to the change of the electric resistance, an amount of a current flowing into the film is increased. Finally, heat is generated evenly in each surface and the inside of the film, so that graphitization progresses evenly with ease, even when the raw material film is such an insulative polymeric film. Further, the electric conductivity becomes high in the surface of the film, so that electric fields are not concentrated in a certain portion in the film. With this, local heat generation never occurs. As a result, graphitization progresses evenly in the surface and inside of the film. Further, a portion graphitized through the heating has excellent crystallinity and excellent heat resistance. Therefore, graphite thus obtained has such a high quality that even when electric fields are concentrated in a certain portion thereof and cause generation of heat locally, the film is never broken.

Further detailed academic research is required to understand why and how the graphite film obtained by using the producing method of the present invention has uniformity (evenness) better than the graphite film obtained by using each producing method of the conventional techniques. However, the why and how can be hypothesized as described above.

<How the Raw Material Film is Held in the Electrifiable Vessel in the First Method of the Present Invention for Graphitizing the Raw Material Film Therein by Electrifying the Vessel>

The raw material film is held in the vessel (e.g., a graphite vessel) that can be directly electrified by voltage application, in the following manner, for example. That is, the raw material film is sandwiched by metal plates or graphite plates, and then the raw material film thus sandwiched is brought into contact with a wall or the bottom of the vessel. Except for weight of the metal plates or graphite plates, no particular pressure is exerted on the raw material film. However, this is not only the way of holding the raw material film.

<Electrifying Method and State in Which Carbon Powder are Filled Between the Graphite Vessel and the Raw Material Film and/or Full of Carbon Powder are Provided on and Around the Graphite Vessel>

The following explains a process of graphitizing the raw material film in the present invention, particularly, an electrifying method. The electrification carried out by applying a voltage refers to electrification carried out by application of an AC voltage and/or a DC voltage.

In the present invention, the process of graphitizing the raw material film includes a step of (i) holding the raw material film in the vessel that is capable of being electrified by voltage application thereto and (ii) electrifying the vessel by applying a voltage thereto, so as to graphitizing the raw material film. It is preferable that the electrification be carried out by using, e.g., the following methods (1) through (4). Note that: the description herein assumes that the vessel is a graphite vessel; however, the vessel is not limited to a graphite vessel.

(1) A method of electrifying a graphite vessel holding a raw material film therein, by applying a voltage to the graphite vessel.

(2) A method of electrifying a graphite vessel, which holds a raw material film and has an outer portion covered with carbon powder (full of carbon powder are provided on and around the outer portion), by applying a voltage to the graphite vessel via the carbon powder.

(3) A method of electrifying a graphite vessel holding a raw material film covered with carbon powder (holding the raw material film in such a manner that the carbon powder are filled between the graphite vessel and the raw material film), by applying a voltage to the graphite vessel.

(4) A method of electrifying a graphite vessel, which holds a raw material film covered with carbon powder (holds the raw material film in such a manner that the carbon powder are filled between the graphite vessel and the raw material film) and is covered with carbon powder (has an outer portion on and around which full of carbon powder are provided), by applying a voltage to the graphite vessel via the carbon powder.

Judging from the respective electric conductivities of the directly electrifiable vessel and the produced film, a current of 10 mA or greater flows in the raw material film as a result of the electrification, although the current flowing therein depends on the size of the sample. Accordingly, the vessel and/or the film generate Joule heat. Even in cases where the raw material is initially an insulator and then is changed into a conductor, a graphite film with high quality can be stably produced by preventing rapid temperature increase. The rapid temperature increase is prevented by controlling throwing power.

In the conventional heating treatment carried out under the atmosphere and/or the reduced pressure, the surface of the raw material film is heated by (i) heat conducted via the contact portion thereof with a heater or via the atmospheric gas and/or (ii) radiant heat from a/the heater. However, with such heating, graphitization progressed unevenly. This caused decrease of the overall heat conductivity of the film. Further, due to the graphitization progressing from the surface of the raw material film, it was difficult for decomposition gas to get out from the inside of the raw material film, especially in cases where the raw material film was a thick one. The decomposition gas did not get out therefrom with ease as such, with the result that the film is damaged. Even in cases where the film was not broken, graphitization did not progress sufficiently in the inside of the film as compared with that in a thin film. Thus, the film had a heat conductivity much inferior to that of the thin film.

On the contrary, in the present invention, a voltage is applied to the raw material film via the vessel holding the raw material film, in the step of graphitizing the raw material by applying the voltage to the vessel so as to electrify the vessel accordingly, the raw material film is electrified and heated, with the result that the raw material film generates heat. The heat thus generated contributes to the graphitization of the raw material film. As such, the inside and surface of the film are evenly heated, and heating is sufficiently carried out from the surroundings of the film. This makes it possible to obtain a graphite film whose electric conductivity and heat conductivity are excellent more than those of the conventional graphite film. Even when the raw material film has a thickness of approximately 125 μm or approximately 225 μm thicker than the thickness of the film used in the conventional techniques, the heating is carried out evenly in the inside and surface of the film and from the surroundings of the film, so that the surface and inside of the film are simultaneously graphitized. With this, no graphite layer preventing generation of decomposition gas is formed in the surface of the film, so that decomposition gas gets out from the inside of the film with ease. Accordingly, film breakage due to the decomposition gas never occurs. This makes it possible to obtain a thick graphite film having excellent electric conductivity and excellent heat conductivity.

In the electrifying method (2), the raw material film is held in the graphite vessel whose outer portion is covered with the carbon powder and a voltage is applied to the graphite vessel via the carbon powder. For acquirement of an excellent graphite film having a high heat conductivity and unvaried properties, such an electrifying method (2) is superior to the above electrifying method (1) in which the raw material film is held in the graphite film and a voltage is applied directly to the graphite vessel. This is because the graphite vessel covered with carbon powder allows evenly electrifying and heating the graphite vessel and/or the raw material film.

Further, in each of the electrifying methods (3) and (4), the raw material film covered with the carbon powder are held in the graphite vessel. This makes it possible to evenly electrify and heat the graphite vessel and/or the raw material film, so that the electrifying methods (3) and (4) are preferable.

The heat generated as a result of the electrification and conducted to the raw material film needs to have a temperature of 2400° C. or higher at minimum. It is preferable that the raw material film be heated at a temperature of 2600° C. or higher and be heated at a temperature of 2700° C. or higher in the end. It is more preferable that the raw material film be heated at a temperature of 2800° C. or higher.

<The Second Method of the Present Invention: Graphitizing a Raw Material Film Held in a Vessel (A) Capable of Being Electrified Held in a Vessel (B) Capable of Being Electrified, by Electrifying all of Them>

The second method of the present invention for producing a graphite film includes the step of (i) holding a raw material film, which is made of a polymeric film and/or a carbonized polymeric film, in each below-described "vessel (A) that is capable of being electrified by applying a voltage thereto", (ii) holding the vessel (A) in a vessel (B), and (iii) electrifying the vessels and the raw material film in a below-described manner, so as to graphitize the raw material film.

<How the Vessel(s) (A) are Held in the Vessel (B)>

Firstly explained is the first graphitizing method of the present invention. In the first graphitizing method of the present invention, a vessel (A) is not held in another vessel (B). That is, the first graphitizing method is such a graphite producing method that does not use two types of vessel but uses one vessel so as to graphitize the polymeric film or carbonized polymeric film through the direct electrification. Specifically, in the first graphitizing method, the raw material films are held respectively in vessels and then carbon powder are provided on and around the outer portion of the vessels so as to fulfill gaps therebetween, and then the raw material film, the vessel and the carbon powder are electrified as a whole, with the result that a graphite film is produced. However, in cases where a plurality of vessels are each covered with carbon powder and electrified respectively for the sake of producing graphite, different vessels respectively holding the raw material films would produce different qualities of produced graphite. Specifically, the qualities possibly differ due to (i) a difference in density of the carbon powder provided on and around each of the vessels and (ii) a difference in the electric resistances of the vessels.

Explained next is the second graphitizing method of the present invention. In this process of the present invention, i.e., in this process of graphitizing the raw material film, a voltage is applied to a vessel (B) holding vessels (A) respectively holding raw materials. The vessels (A) are held in the vessel (B) in, e.g., the following manners (1) through (3) (see FIG. 1 through FIG. 3). Note that: the description herein assumes that each of the vessels (A) has a rectangular solid shape and the vessel (B) has a cylindrical shape; however, the shapes of the vessels (A) and (B) are not limited to the rectangular solid shape and the cylindrical shape, respectively.

(1) FIG. 1 shows that the vessels (A) respectively holding the raw material films are held in the vessel (B) in such a manner that the vessels (A) are covered with carbon powder (the carbon powder are provided on and around the vessels (A)) and do not make contact with the vessel (B).

Figure 2:
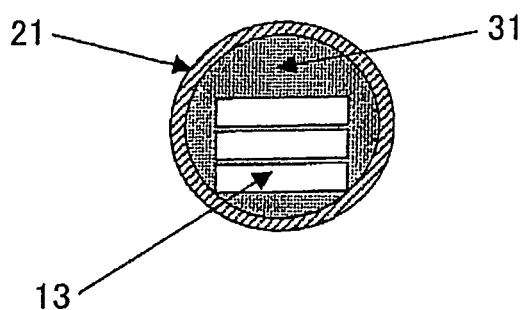
FIG. 2 illustrates how to hold vessels (A) in a vessel (B).

(2) FIG. 2 shows that the vessels (A) respectively holding the raw material films are held in the vessel (B) in such a manner that the vessels (A) are covered with carbon powder (the carbon powder are provided on and around the vessels (A)) and make contact with the vessel (B).

Figure 3:
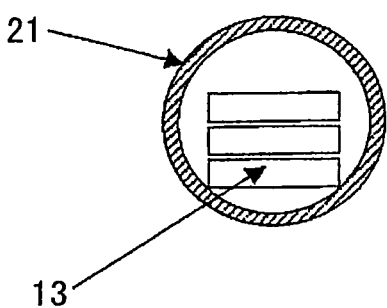
FIG. 3 illustrates how to hold vessels (A) in a vessel (B).

(3) FIG. 3 shows that the vessels (A) respectively holding the raw material films are held in the vessel (B) in such a manner that the vessels (A) make contact with the vessel (B). In the manner shown in FIG. 3, no carbon powder are used for the retention of the vessels (A) in the vessel (B).

In the present invention, the vessels (A) respectively holding the raw material films are held in the vessel (B), so that a voltage and/or heat are applied evenly to the vessels (A). With this, the qualities of graphite respectively produced in the vessels (A) never differ from one another. This is a feature of the present invention. Further, the carbon powder are provided on and around the vessels (A) at an even density (are filled between each of the vessels (A) and the vessel (B) at an even density, in cases where the carbon powder are provided so as to be filled therebetween), so that the qualities of the graphite respectively produced in the vessels (A) never differ from one another even in the case where the plurality of vessels (A) are used. This is another feature of the present invention.

In cases where the directly electrifiable vessels (A) respectively holding the raw material films is held in the directly electrifiable vessel (B) and they are electrified through voltage application, it is preferable that the vessels (A) do not make contact with the vessel (B). A reason of this is as follows.

Consider a case where the vessels (A) respectively holding the raw material films are held in but do not make contact with the vessel (B) and the carbon powder are provided to cover the outer portion of each of the vessels (A) (are provided on and around the vessels (A) (preferably are provided to be filled between each of the vessels (A) and the vessel (B)). In this case, the vessels (A) are evenly and entirely electrified, in response to voltage application, via the carbon powder provided on and around the vessels (A). As such, the voltage is applied evenly to the entire vessels (A), so that the vessels (A) generate heat evenly due to the electrification. As a result, the raw material films are turned into excellent graphite with no variance in quality.

On the other hand, consider a case where the vessels (A) are in contact with the vessel (B) and are electrified by applying a voltage to the vessel (B). In this case, the electrification of the vessels (A) occurs only via the portion where the vessels (A) is in contact with the vessel (B), so that the vessels (A) do not evenly generate heat. As a result, the uniformity in graphitization of the raw material films is insufficient as compared with that in the case where the vessels (A) are held in the vessel (B) in the aforementioned manner (1).

On the other hand, consider a case where the vessels (A) respectively holding the raw material films are held in and make contact with the vessel (B) and the carbon powder are provided on and around the vessels (A) (preferably are provided so as to be filled between each of the vessels (A) and the vessel (B)). In this case, the electrification of the vessels (A) occurs via (i) the portion where the vessels (A) is in contact with the vessel (B) and (ii) the carbon powder covering the outer portion of each of the vessels (A). However, the vessel (B) and the carbon powder have electric resistances different from each other, so that the electrification firstly occurs via one (either one of the vessel (B) and the carbon powder) having a resistance lower than that of the other one. Accordingly, the uniformity in heat generated by the vessels (A) due to the electrification is insufficient as compared with that in the case where the vessels (A) are held in the vessel (B) in the aforementioned manner (2).

Thus, the most preferable manner of holding the vessels (A) in the vessel (B) is the aforementioned manner (1). The second most preferable one is the aforementioned manner (2). The least preferable one is the aforementioned manner (3).

In any one of the holding manners respectively shown in FIG. 1 through FIG. 3, carbon powder may be provided so as to cover each of the raw material films (may be provided between each of the vessels (A) and each of the raw material films (preferably may be provided so as to be filled between the vessel (A) and the raw material film)). As an alternative, carbon powder may be provided so as to cover the outer portion of the vessel (B) (may be provided on and around the vessel (B) (preferably full of carbon powder may be provided on and around the vessel (B))).

<A Method of Electrifying the Vessels (A) Respectively Holding the Raw Material Films>

The following explains a process of graphitizing the raw material films in the present invention, particularly, an electrifying method. The electrification carried out by applying a voltage refers to electrification carried out by application of an AC voltage and/or a DC voltage.

The following two methods (1) and (2) are examples of the method of electrifying (i) the vessels (A) respectively holding the raw material films and/or (ii) the raw material films. Note that: the description herein assumes that the vessels are graphite vessels; however, the vessels are not limited to graphite vessels. Further, the description herein also assumes that each of the vessels (A) has a rectangular solid shape and the vessel (B) has a cylindrical shape; however, the shapes of the vessels (A) and (B) are not limited to a rectangular solid shape and a cylindrical shape, respectively.

Figure 4:
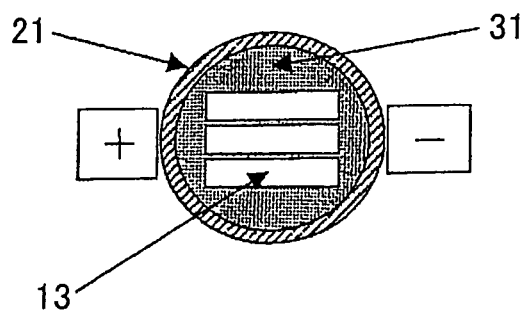
FIG. 4 illustrates how to electrify vessels (A) and a vessel (B).

(1) A method of electrifying the graphite vessels (A) and/or the raw material films, as illustrated in FIG. 4, wherein: the graphite vessels (A) are held in but are not in contact with the graphite vessel (B), and the outer portions of the graphite vessels (A) are covered with carbon powder (carbon powder are provided between each of the vessels (A) and the vessel (B) (preferably are provided to be filled therebetween)), and a voltage is directly applied to the graphite vessel (B) so as to electrify the graphite vessels (A) and/or the raw material films via the graphite vessel (B) and the carbon powder.

Figure 5:
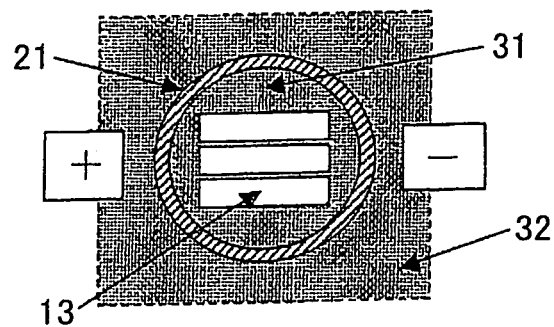
FIG. 5 illustrates how to electrify vessels (A) and a vessel (B).

(2) A method of electrifying the graphite vessels (A) and/or the raw material films, as illustrated in FIG. 5 wherein: the graphite vessels (A) are held in but are not in contact with the graphite vessel (B), and the outer portions of the graphite vessels (A) are covered with carbon powder (carbon powder are provided between each of the carbon vessels (A) and the carbon vessel (B) (preferably the carbon powder are provided so as to be filled therebetween), and the outer portion of the graphite vessel (B) is covered with carbon powder (carbon powder are provided on and around the graphite vessel (B) (preferably carbon powder are provided on and around the graphite vessel (B) so as to fill the gap between the graphite vessel (B) and the other), and a voltage is applied to the carbon powder provided on and around the vessel (B), so as to electrify the graphite vessels (A) and/or the raw material films via the carbon powder covering the vessel (B), the graphite vessel (B), and the carbon powder provided between each of the vessels (A) and the vessel (B).

The holding manner shown in FIG. 5 is better than the holding manner shown in FIG. 4, in terms of acquirement of graphite films having a high heat conductivity and unvaried properties. A reason of this is as follows. That is, by covering the graphite vessel (B) with the carbon powder, the graphite vessels and/or the raw material films are electrified and heated evenly.

In either of the methods of electrifying the vessels (A) and/or the raw material films, each of the raw material films may be covered with carbon powder (the carbon powder may be provided between each of the vessels (A) and each of the raw material films, preferably the carbon powder may be provided to be filled therebetween). Further, the vessels (A) and (B) may be in contact with each other.

In the conventional heating treatment carried out under the atmosphere and/or the reduced pressure, the surface of the raw material film was firstly heated by (i) heat conducted via a contact portion thereof with a heater or via the atmospheric gas, and/or (ii) radiant heat from the heater. However, with such heating, graphitization progressed unevenly. This results in a low overall heat conductivity of the film. Further, due to the graphitization progressing from the surface of the raw material film, it was difficult for decomposition gas to get out from the inside of the raw material film, especially in cases where the raw material film was a thick one. The decomposition gas did not get out therefrom with ease as such, with the result that the film is damaged. Even in cases where the film was not broken, graphitization did not progress sufficiently in the inside of the film as compared with that in a thin film. Thus, the film had a heat conductivity much inferior to that of the thin film.

On the contrary, in the present invention, a voltage is applied to each of the raw material films via each of the directly electrifiable vessels respectively holding the raw material films, in the step of graphitizing the raw material film by applying the voltage to the vessels so as to electrify the vessels. Accordingly, the raw material film is electrified and heated, with the result that the raw material film generates heat. The heat thus generated contributes to the graphitization of the raw material film. As such, the inside and surface of the film are evenly heated, and heating is sufficiently carried out from the surroundings of the film. This makes it possible to obtain a graphite film whose electric conductivity and heat conductivity are excellent more than those of the conventional graphite film. Even when the raw material film has a thickness of approximately 125 µm or approximately 225 µm, which is thicker than the thickness of the film used in the conventional techniques, the heating is carried out evenly in the inside and surface of the film and is carried out from the surroundings of the film, so that the surface and inside of the film are simultaneously graphitized. With this, no graphite layer preventing generation of decomposition gas is formed in the surface of the film, so that decomposition gas gets out from the inside of the film with ease. Accordingly, film breakage due to the decomposition gas never occurs. This makes it possible to obtain a thick graphite film having excellent electric conductivity and excellent heat conductivity.

The heat generated as a result of the electrification and conducted to the raw material film needs to have a temperature of 2400° C. or higher at minimum. It is preferable that the raw material film be heated at a temperature of 2600° C. or higher and be heated at a temperature of 2700° C. or higher in the end. It is more preferable that the raw material film be heated at a temperature of 2800° C. or higher.

Note that the temperatures described in the present invention can be measured by a radiation thermometer placed in, e.g., a part of an outer wall of a directly electrifiable vessel or a part of inside thereof.

Note that the wording "heating treatment (heating)" used in the specification of the present invention has such a broad meaning as follows. While the wording "heating treatment (heating)" used in the conventional technique refers to heating carried out under reduced pressure and/or a gas atmosphere, the wording "heating treatment (heating)" used in the present invention encompasses such a phenomenon that the heat generated as a result of the electrification, which is a feature of the present invention, is conducted to the raw material film. Moreover, the wording "heating treatment (heating)" is likely to be used in the descriptions of making comparison between the present invention and the conventional technique, without distinguishing (i) the conventional heating under reduced pressure, (ii) the heating under a gas atmosphere, and (iii) the conduction of the heat, generated as a result of the electrification, to the raw material film. A reason why the wording "heating treatment (heating)" is thus used without specific distinction is because a heating treatment (heating) is made with a plurality of principles.

<An Angle Formed by the Electrification Direction and the Normal Line of the Raw Material Film>

In the present invention, the raw material film may be so disposed that a line indicating a direction of electrifying the raw material film, and the normal line of the raw material film form an angle more than 0° but less than 180°. The angle formed by them refers to an angle formed by (i) a straight line representing the direction of the electrification from the positive electrode to the negative electrode and (ii) the normal line of the direction of the surface of the raw material film.

It is preferable that the angle formed by the normal line of the direction of the surface of the raw material film and the straight line representing the electrification direction fall within a range from 60° to 120°. It is more preferable that the angle fall within a range from 75° to 105°. It is the most preferable that the angle be 90°.

A reason why it is preferable that the angle formed by the electrification direction of the raw material film and the normal line thereof be 90° is that: when the angle is 90°, the electrification direction corresponds to the direction of the surface of the raw material film, so that the raw material film can be evenly electrified. This makes it possible to obtain a graphite film having excellent quality.

In the meanwhile, when the angle formed by the electrification direction and the direction of the surface of the raw material film is 0° and therefore corresponds to the direction of the thickness of the raw material film, the raw material film is electrified via plate-like graphite used to hold the raw material film in the vessel (A). Accordingly, the electrification of the raw material film is possibly retarded as compared with the case where the angle is 90°. Thus, for the heating through the electrification of the raw material film, the angle of 90° is advantageous over the angle of 0°.

When the angle formed by the electrification direction and the direction of the surface of the raw material film is 0°, the electrification direction corresponds to the direction of the thickness of the raw material film. On the other hand, when the angle is 90°, the electrification direction corresponds to the direction of the surface of the raw material film, so that an electrification distance is longer when the angle is 90°. Thus, for the heat generation of the raw material film due to the electrification, the angle of 90° is advantageous over the angle of 0°.

<Vessel Directly Electrifiable by Voltage Application>

The wording "vessel that is capable of being electrified by applying a voltage thereto" refers to a vessel made of, e.g., tungsten, molybdenum, or graphite. The shape of the vessel is not particularly limited, but may be a simple shape such as a shape of a plain plate. As an alternative, the vessel may have a cylindrical shape, and the raw material film may be wound on the vessel. That is, the shape of the vessel is not particularly limited as long as the vessel can hold the raw material film. However, in view of easiness in manufacturing and industrial availability, the vessel has a rectangular solid shape or a cubic shape. It is preferable that the vessel (B) in the form of a block, a lunchbox having a lid or the like, or the like.

Note that each of the used vessels, i.e., the vessels (A) and (B) described in the specification of the present invention may or may not be hermetically sealed while being used.

It is considered that each of the vessels is hermetically sealed by providing, in the vessel cover allowing for hermetic sealing of the vessel. When the vessel is hermetically sealed, pressure inside the vessel becomes higher or lower than the normal pressure as a gas therein is expanded or is contracted due to temperature increase or temperature decrease.

In the arrangement in which each of the vessels (each of the vessels (A) and (B)) is not sealed hermetically, the vessel is provided with a cover (e.g., a lid) but the cover is such that a gas, which is expanded or contracted due to temperature increase or temperature decrease, can goes out from or comes into the inside of the vessel via a space between the vessel and the cover. Of course, the arrangement in which the vessels are not sealed hermetically may be arranged such that the vessels are not provided with a cover and are used as they are.

In the present invention, the inside of the vessel may or may not be hermetically sealed.

<Graphite Vessel>

It is especially preferable to use a graphite vessel for each of the used vessels (A) and (B) that are heated to a temperature of approximately 2500° C., in view of easiness in handling and industrial availability. The meaning of the wording "graphite" used herein is so broad as to encompass a material that can be heated to a temperature of approximately 2500° C. and that mainly contains graphite, such as isotropic graphite or extruded graphite. Isotropic graphite is excellent in electric conductivity, heat conductivity, and homogeneity, so that isotropic graphite is preferable in cases where the vessel is fed with a current and is used repeatedly.

<A Case where the Directly Electrifiable Vessel (B) has a Cylindrical Shape>

In the present invention, the shape of the vessel (B) is not limited but is preferably a cylindrical shape. This is because a voltage is applied evenly with ease to a vessel (B) having a cylindrical shape, as compared with a vessel having a quadrangle solid shape. Accordingly, the entire vessel (A) is evenly electrified and heated. As such, such a vessel having a cylindrical shape is advantageous. On the other hand, the shape of the vessel (A) is not limited but is preferably either (i) a quadrangle solid shape such as a cubic shape or a rectangular solid shape, or (ii) a cylindrical shape in view of high industrial availability and the like. Further, for convenience of handling, a vessel having a lid is preferable as the vessel (A).

<A Case where the Raw Material Film is Insulative>

Further, the raw material film may be initially insulative in the producing process. A reason of this is as follows. When carbonization process of such an insulative raw material film is carried out by the heating through the electrification, the raw material film is uniformly carbonized, with the result that electric fields are not concentrated in a certain place in the film during graphitization thereof. Accordingly, heat generation never occurs locally, so that the graphitization progresses uniformly in a surface and inside of the film. This makes it possible to obtain a graphite film having an excellent heat conductivity.

<Carbon Powder>

The carbon powder used in the present invention is heated (through the electrification) to a temperature of approximately 2500° C.

The concept of the wording "carbon powder" used herein is broad, i.e., the carbon powder are not particularly limited but should be powder mainly containing carbon. For example, the carbon powder may be powder obtained by grinding or granulating a material, a powder, or a fiber, each of which mainly contains a organic material and which has been subjected to heating treatment. The heating treatment is carried out at a temperature of not less than 200° C., preferably not less than 500° C., more preferably not less than 1000° C. or not less than 1500° C. Further, a material mainly containing carbon such as natural and/or artificial pitch, coax, or carbon black may be used. As an alternative, the carbon powder may be made of graphite. The concept of the wording "graphite" used herein is so broad as to encompass a material that can be heated to the aforementioned temperature and that mainly contains graphite. Therefore, examples of the carbon powder made of graphite include: powder obtained by grinding graphite cloths, powder obtained by grinding isotropic graphite, and powder obtained by grinding extruded graphite. The grain shape, grain diameter, and grain diameter distribution of each of the carbon powder are not particularly limited.

The carbon powder in the present invention may be carbon particles or graphite particles as described below.

<Graphite Particles>

The graphite particles used in the present invention are heated (through the electrification) to a temperature of approximately 2500° C. The concept of "graphite" of which the graphite particles are made is so broad as to encompass a material that can be heated to the above temperature and that mainly contain graphite. Examples thereof include: powder obtained by grinding graphite cloths, powder obtained by grinding isotropic graphite, powder obtained by grinding extruded graphite, and carbon black. The grain shape, grain diameter, and grain diameter distribution of each of the carbon powder are not particularly limited.

<Carbon Particles>

The carbon particles used in the present invention is heated (through the electrification) to a temperature of approximately 2500° C.

The concept of the wording "carbon particles" is broad, i.e., the carbon particles are not particularly limited as long as the particles mainly contain carbon. For example, the carbon particles may be particles obtained by grinding or granulating a material, a powder, or a fiber, each of which mainly contains an organic material and which has been subjected to heating treatment. The heating treatment is carried out at a temperature of not less than 200° C., preferably not less than 500° C., more preferably not less than 1000° C. or not less than 1500° C.

Examples of the fiber, a raw material for the carbon particles, include: (i) one organic fiber selected from a vegetable fiber, an animal fiber, a regenerated fiber, a semisynthetic fiber, and a synthetic fiber, and (ii) a fiber obtained by combining organic fibers selected from the above fibers.

Examples of the vegetable fiber include cotton and hemp (flax or ramie).

Examples of the animal fiber include fibers such as silk and wool (cashmere, wool, mohair, or camel).

Examples of the regenerated fiber include rayon and cupra.

Examples of the semisynthetic fiber include acetate, triacetate, and promix.

Examples of the synthetic fiber include nylon, aramid, acryl, vinylon, vinylidene, polyvinyl chloride, polyester, polyethylene, polypropylene, benzoate, polychlal, phenols, and polyurethane.

Further examples of the vegetable fiber include: (i) wood pulps such as a broadleaf tree pulp and a coniferous tree pulp; (ii) woody plants and herbaceous plants such as a straw pulp, a bamboo pulp, and a kenaf pulp; and (iii) pulp fibers obtained from used paper, waste paper, and the like.

The definitions of the above fibers are made in reference to "Fiber Handbook 1993" (Japan Chemical Fiber Association), etc.

Of course, the fiber may be a mixed fiber of an organic fiber and an inorganic fiber. Examples of the inorganic fiber include a glass fiber, a carbon fiber, a ceramic fiber, a whisker, and a combination thereof.

The above description assumes that the raw material for the carbon powder is a fiber; however, the raw material therefor is not limited to a fiber. The carbon powder may be made of a thermoplastic resin, a thermosetting resin, or an epoxy resin.

The concept of "graphite" of which the graphite powder, one example of the carbon powder, are made is so broad as to encompass a material that can be heated to the aforementioned temperature and that mainly encompasses graphite. Examples thereof include: powder obtained by grinding graphite cloths, powder obtained by grinding isotropic graphite, powder obtained by grinding extruded graphite, and carbon black.

The grain shape, grain diameter, and grain diameter distribution of each of the carbon powder are not particularly limited.

Further, the carbon particles may be obtained from a below-described thermoplastic resin or thermosetting resin each having been subjected to heating treatment.

Specific examples of the thermoplastic resin include: polyethylene, polypropylene, polyisoprene, polybutadiene, polyethylene chloride, polyvinyl chloride, styrene resin, anti-impact polystyrene, acrylonitrile-styrene resin (AS resin), acrylonitrile-butadiene-styrene resin (ABS resin), methylmethacrylate-butadiene-styrene resin (MBS resin) methylmethacrylate-acrylonitrile-butadiene-styrene resin (MABS resin), acrylonitrile-acryl rubber-styrene resin (AAS resin), polymethyl(meth)acrylate, polycarbonate, modified polyphenylene ether (PPE), (aliphatic and/or aromatic) polyamide, polyether (such as polyethyleneterephthalate, polybutyleneterephthalate, polyethylenenaphthalate, etc.), polyphenylenesulfide, polyimide, polyether ether ketone, polysulfone, polyarylate, polyether ketone, polyether nitrile, polythioether sulfone, polyethersulfone, polybenzimidazole, polycarbodiimide, polyamideimide, polyetherimide, liquid crystal polymer, composite plastics, etc.

Examples of the thermo-curing compound include epoxy compounds, isocyanate compounds, ester cyanate compounds, compounds having a vinyl group such as acryl, methacryl, and vinyl, etc., xylene resin, guanamine resin, DFK resin, phenol resin, furan resin, urethane resin, maleic resin, melamine resin, urea resin, etc.

Examples of the epoxy compounds include: bisphenol resin such as epicoat 828 (Japan Epoxy Resins Co. Ltd.); o-cresol novolac resin such as 180S65 (Japan Epoxy Resins Co. Ltd.); bisphenol A novolac resin such as 157S70; trishydroxyphenylmethane novolac resin such as 1032H60 (Japan Epoxy Resins Co. Ltd.); naphthalene alakyl novolac resin such as ESN 375; glycidylamine-based resin such as tetraphenylol ethane 1031S (Japan Epoxy Resins Co. Ltd.), YGD 414S (Tohto Kasei Co. Ltd.), trishydroxyphenylmethane EPPN 502H (Nippon Kayaku Co. Ltd.), special bisphenol VG3101L (Mitsui Chemicals Inc.), special naphthol NC7000 (Nippon Kayaku Co. Ltd.), TETRAD-X, TETRAD-C (Mitsubishi Gas Chemical Company Inc.); etc.

Examples of the isocyanate compounds include aliphatic, aliphatic-cyclic, or aromatic diisocyanate such as 1,4-tetramethylenediisocyanate, 1,5-pentamethylenediisocyanate, 1,6-hexamethylenediisocyanate, 2,2,4-trimethyl-1,6-hexamethylenediisocyanate, lysine diisocyanate, 3-isocyanatemethyl-3,5,5-trimethylcyclohexylisocyanate (isophoronediisocyanate), 1,3-bis(isocyanatemethyl)-cyclohexane, 4,4'-dicyclohexylmethanediisocyanate, tolylenediisocyanate, 4,4'diphenylmethanediisocyanate, 1,5-naphthalenediisocyanate, tolidinediisocyanate, xylylenediisocyanate, etc.

The examples of the isocyanate compounds also include derivatives of the aliphatic, aliphatic-cyclic, or aromatic diisocyanates, such as isocyanurate-modified isocyanate, burette-modified isocyanate, urethane modified isocyanate, etc. Moreover, the examples of the isocyanate compounds also include blocked isocyanate in which the isocyanate group of the isocyanate compound is blocked with a blocking agent.

Examples of the blocking agent include alcohol compounds, phenol compounds, active methylene compounds, mercaptane compounds, acid amide compounds, acid imide compounds, imidazole compounds, urea compounds, oxime compounds, amine compounds, bisulphite compounds, imine compounds, imide compounds, pyridine compounds, etc. These compounds may be used solely or in combination. Specific examples of the alcohol-type blocking agent include methanol, ethanol, propanol, butanol, 2-ethylhexanol, methyl cellosolve, butyl cellosolve, methyl carbitol, benzylalcohol, cyclohexanol, etc. Specific examples of the phenol-type blocking agent include phenol, cresol, ethylphenol, butylphenol, nonylphenol, dinonylphenol, styrenated phenol, hydroxybenzoic ester, etc. Specific examples of the active methylene-type blocking agent include dimethyl malonate, diethyl malonate, methyl acetoacetate, ethyl acetoacetate, acetylacetone, etc. Specific examples of the mercaptane-type blocking agent include butylmercaptane, dodecylmercaptane, etc. Specific examples of the acid amide-type blocking agent include acetanilide, acetic amide, ε-caprolactam, δ-valerolactam, γ-butyrolactam, etc. Specific examples of the acid imide-type blocking agent include succinimide, maleimide, etc. Specific examples of the imidazol-type blocking agent include imidazol, 2-methylimidazol, etc. Specific examples of the urea-type blocking agent include urea, thio urea, ethylene urea, etc. Specific examples of the oxime-type blocking agent include formaldehydeoxime, acetaldehydeoxime, acetoxime, methylethylketooxime, cyclohexanonoxime, etc. Specific examples of the amine-type blocking agent include diphenylamine, aniline, carbazole, etc. Specific examples of the imine-type blocking agent include ethyleneimine, polyethyleneimide, etc. Specific examples of the bisulphite-type blocking agent include bisulphite soda, etc. Specific examples of the pyridine-type blocking agent include 2-hydroxypyridine, 2-hydroxyxynolyne, etc.

Specific examples of the compounds having a vinyl group such as acryl, methacryl, vinyl, etc. include EO modified bisphenol F diacrylate (n=2 to 50), EO modified bisphenol A diacrylate (n=2 to 50), EO modified bisphenol S diacrylate (n=2 to 50), 1,6-hexanedioldiacrylate, neopentylglycoldiacrylate, ethyleneglycoldiacrylate, pentaerythritoldiacrylate, trimethylolpropanetriacrylate, pentaerythritoltriacrylate, dipentaerythritolhexaacrylate, tetramethylolpropanetetraacrylate, tetraethyleneglycoldiacrylate, 1,6-hexanedioldimethacrylate, neopentylglycoldimethacrylate, ethyleneglycoldimethacrylate, pentaerythritoldimethacrylate, trimethylolpropanetrimethacrylate, pentaerythritoltrimethacrylate, dipentaerythritolhexamethacrylate, tetramethylolpropanetetramethacrylate, tetraethyleneglycoldimethacrylate, methoxydiethyleneglycolmethacrylate, methoxypolyethyleneglycolmethacryalte, β-methacroyloxyethylhydrodienphthalate, β-methacroyloxyethylhydrodiensuccinate, 3-chloro-2-hydroxypropylmethacrylate, stearylmethacrylate, phenoxyethylacrylate, phenoxydiethyleneglycolacylate, phenoxypolyethyleneglycolacrylate, β-acryloyloxyethylhydrodienesuccinate, laurylacylate, ethyleneglycoldimethacrylate, diethyleneglycoldimethacrylate, triethyleneglycoldimethacrylate, polyethyleneglycoldimethacrylate, 1,3-buthyleneglycodimethacrylate, 1,6-hexanedioldimethacrylate, neopentylglycoldimethacrylate, polypropyleneglycoldimethacrylate, 2-hydroxy-1,3-dimethacroxypropane, 2,2-bis[4-(methacroxyethoxy)phenyl]propane, 2,2-bis[4-(methacroxy·diethoxy)phenyl]propane, 2,2-bis[4-(methacroxy·polyethoxy)phenyl]propane, polyethyleneglycoldiacrylate, tripropyleneglycoldiacrylate, polypropyleneglycoldiacrylate, 2,2-bis[4-

(acryloxy•diethoxy)phenyl]propane, 2,2-bis[4-(acryloxy•polyethoxy)phenyl]propane, 2-hydroxy-1-acryloxy 3-methacroxypropane, trimethylolpropanetrimethacrylate, tetramethylolmethanetriacrylate, tetramethylolmethanetetraacrylate, methoxydipropyleneglycolmethacrylate, methoxytriethyleneglycolacrylate, nonylphenoxypolyethyleneglycolacrylate, nonylphenoxypolypropyleneglycolacrylate, 1-acryloyloxypropyl-2-phthalate, isostearylacrylate, polyoxyethylenealkyletheracrylate, nonylphenoxyethyleneglycolacrylate, polypropyleneglycoldimethacrylate, 1,4-butanedioldimethacrylate, 3-methyl-1,5-pentanedioldimethacrylate, 1,6-mexanedioldimethacrylate, 1,9-nanonediolmethacylate, 2,4-diethyl-1,5-pentanedioldimethacrylate, 1,4-cyclohexanedimethanoldimethacrylate, dipropylenegycoldiacrylate, tricyclodecanedimethanoldiacrylate, 2,2-hydrogenated bis[4-acryloxy•polyethoxy]phenyl]propane, 2,2-bis[4-acryloxy•polypropoxyphenyl]propane, 2,4-diethyl-1,5-pentanedioldiacrylate, ethoxy trimethylolpropanetriacrylate, propoxy trimethylolpropanetriacrylate, isocyanuric acid tri(ethaneacrylate), pentasrytoltetraacrylate, ethoxy pentastrytoltetraarylate, propoxy pentastrytoltetraacrylate, ditrimethylolpropanetetraacrylate, dipentaerythritolpolyacrylate, triallyl isocyanurate, glycidylmethacrylate, glycidylallylether, 1,3,5-triacryloylhexahydros-triazine, triallyl-1,3,5-benzenecarboxylate, triallylamine, triallylcytrate, triallylphosphate, allobarbital(5,5-diallylbarbituric acid), diallylamine, diallyldimethylsilane, diallyldisulfide, diallylether, zarilcyarate, diallylisophthalate, diallylterephthalate, 1,3-diallyloxy-2-propanol, diallylsulfidediallylmalate, 4,4'-isopropylidenediphenoldimethacrylate, 4,4'-isopropylidenediphenoldiacrylate, etc. It should be noted that the present invention is not limited to these compounds. For better cross-linking density, it is preferable to use a monomer having two or more functional groups.

The thermo-curing compound may be one compound or a combination of several compounds.

The cyanate ester compound is not particularly limited as long as the compound has a cyanate ester in its molecule. Examples of the cyanate ester compound include the following compounds.

Namely, 1,3-dicyanate benzene, 1,4-dicyanate benzene, 1,3,5-tricyanate benzene 1,3-dicyanate naphthalene, 1,4-dicyanate naphthalene, 1,6-dicyanate naphthalene, 1,8-dicyanate naphthalene, 2,6-dicyanate naphthalene, 2,7-dicyanate naphthalene, 1,3,6-tricyanate naphthalene, 2,2-bis(3,5-dicyclo-4-cyanatephenyl)propane, tris(4-cyanatephenyl)phosphite, tris(4-cyanatephenyl)phosphate, tris(4-cyanatephenyl)phosphate, and polycyanate compounds that are polycyclic benzene obtained by phenol resin and halogenated cyanate. Similarly, an oligomer obtained by heating any of the above-mentioned cyanate esters may be used.

The cyanate esters may be used solely or in combination.

<Polyimide Film>

The polyimide film is more easily carbonated and graphitized than a raw material film made of another organic compound. Thus, the polyimide film has such an electric conductivity that is easily increased uniformly over the film by a low temperature and is easy to be increased. Therefore, in case where the polyimide film held in the vessel which is directly electrifiable by applying voltage thereon is graphitized by applying a voltage on the vessel to cause electrification, the current flows uniformly in the polyimide film as the carbonization proceeds. Such an uniformly-flowing current results in heat generated uniformly in the surface portion and inside portion. Therefore, a graphite having a high heat conductivity even if the film has a thick thickness, as well as a thin thickness. Moreover, the graphite thus produced is excellent in crystallinity and heat resistance. Thus, it is possible to obtain a graphite of high quality because the graphite will not be damaged even if the film is locally heated due to concentration of the electric field.

<Polyimide Film and Birefringence>

Birefringence (Δn) of the polyimide film for use in the present invention relates to alignment of the molecules in the in-plane directions. The birefringence of the polyimide film for use in the present invention is 0.08 or more, preferably 0.10 or more, further preferably 0.12 or more, and most preferably 0.14 or more in any in-plane directions.

<Raw Material Film and Birefringence>

A higher birefringence facilitates the carbonation and graphitization of the film more greatly, and thus gives higher electric conductivity to the film. As a result, in the step of graphitizing the raw material film by applying, for graphitization, a voltage on the directly electrifiable vessel in which the raw material film is held, the current flows uniformly according to the electric resistance that is changed as the film portion is carbonated. Further, the amount of the current flowing through the film is increased as the carbonation proceeds. Thus, the heat generation takes place uniformly in the surface portion and inside portion, thereby making it easier to carry out the graphitization more uniformly. Moreover, the electric conductivity increases uniformly in the film plane, avoiding local concentration of the electric field inside the film. This avoids local heat generation. As a result, the graphitization takes places uniformly in the surface portion and inside portion.

Moreover, the carbonization and graphitization take place at a low temperature. Thus, the electric conductivity of the film starts to increase in the heat treatment using such a low temperature. This allows uniform heat generation in the surface portion and the inside portion, thereby making it easier to attain even graphitization.

Furthermore, a higher birefringence gives the film excellent crystallinity and excellent heat resistance. Thus, even if the electric field is locally concentrated to cause local heat generation, the film will not be damaged and the graphite thus obtained will have a high quality.

Moreover, because the graphitization proceeds uniformly in the surface portion and the inside portion it is possible to obtain the graphite of excellent heat conductivity even if the raw material has a thick thickness.

Further, a higher birefringence gives a better heat conductivity of the graphite film thus obtained. Therefore, a maximum temperature in the heat treatment of the raw material film by the heat generated by the electrification can be lower, thereby reducing power consumption. Further, it is possible to obtain a graphite of high quality even by a short heat treatment.

It has not been fully understood why a higher birefringence makes the graphitization easier. The graphitization requires molecular realignment, which can be done with lowest effort in the polyimide film whose birefringence is high and molecules are highly aligned. Therefore, it is guessed that a polyimide film in which the molecules are more highly aligned is more suitable to obtain a graphite film of a high crystallinity with heat treatment by a relatively low maximum temperature of heat generated by the electrification, even if the thickness of the polyimide film is thick.

<Birefringence>

The birefringence here is a difference between a refractive index in a certain in-plane direction of the film and a refractive index in a thickness direction of the film. A birefringence Δnx in an in-plane direction X is obtained by the following equation (Equation 1):

Birefringence Δnx=(Refractive Index Nx in In-plane Direction X)−(Refractive Index Nz in Thickness Direction Nz)   (Equation 1).

Figure 6:
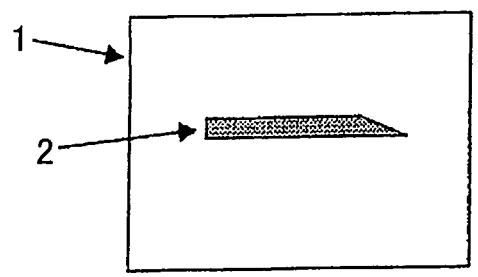
FIG. 6 illustrates a polyimide film and a wedge-shaped sheet.
Figure 7:
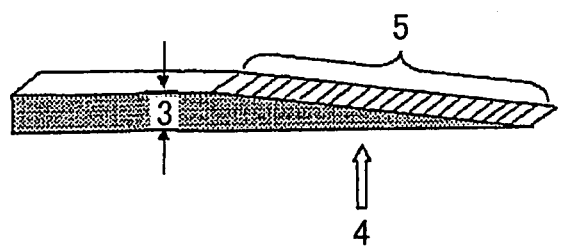
FIG. 7 is a perspective view illustrating the wedge-shaped sheet.

FIGS. 6 and 7 specifically illustrate how to measure the birefringence. In the plane view of FIG. 6, illustrated is a sheet 2 cut out from the film 1 into a narrow wedge shape as a sample for measurement. The wedge-shaped sheet 2 has a narrow and long trapezoidal shape having one declined edge. One of its base angles is the right angle. The sheet 2 is so cut out that the base edge of its trapezoidal shape is parallel to the direction X. FIG. 7 is a perspective view illustrating the sample 2 thus cut out. Sodium light 4 is radiated perpendicularly on a cut-out cross section that corresponds to the base edge of the trapezoidal sample 2. The trapezoidal sample 2 is observed with a polarization microscope from above a cut-out cross section that corresponds to the oblique line of the trapezoidal sample 2. The observation shows interference fringes 5. The birefringence Δnx in the in-plane direction X is expressed by the following equation (Equation 2):

Δnx=n×λ/d   (Equation 2), where a number of the interference fringes is n, λ is wavelength of the sodium D ray, which is 589 nm, d is width 3 of the sample 2, which corresponds to the height of the trapezoidal shape of the sample 2.

The certain "in-plane direction X" may any direction in the plane, for example, may be any of 0° direction, 45° direction, 90° direction, and 135° direction with respect to a direction in which the raw material flows in forming the film.

<Thermal, Mechanical, Physical, and Chemical Properties of Polyimide Film>

The polyimide film for use in the present invention, from which the graphite is produced, has an average linear expansion coefficient of less than $2.5 \times 10^{-5}/°$ C. at temperatures from 100° C. to 200° C. With a linear expansion coefficient of less than $2.5 \times 10^{-5}/°$ C., the polyimide film will not be extended significantly during the heat treatment and it is possible to carryout the graphitization smoothly. This makes it possible to obtain a graphite that is excellent in various properties and is not fragile. The use of such a polyimide film as the raw material makes it possible to start the conversion to the graphite at 2400° C., and attain a graphite of a sufficient crystallinity at 2700° C. The linear expansion coefficient is preferably equal to or less than $2.0 \times 10^{-5}/°$ C.

The linear expansion coefficient of the raw material film is measured by using a TMA (thermal mechanical analyzer). In the measurement of the linear expansion coefficient, a sample is heated to 350° C. at a heating rate of 10° C./min, and then cooled down to room temperatures by air cooling, and then heated to 350° C. at a heating rate of 10° C./min again. When the sample is heated again, the average linear expansion coefficient is measured at temperatures from 100° C. to 200° C. From the average linear expansion coefficient thus measured, the linear expansion coefficient of the raw material film is obtained. More specifically, a thermal mechanical analyzer (TMA: SSC/5200H; TMA120C made by Seiko Corp.) is used to measure the average linear expansion coefficient of a film sample of 3 mm in width and 20 mm in length held by a predetermined jig and pulled with 3 g load under nitrogen atmosphere.

Furthermore, for easy graphitization, the polyimide film for use in the present invention has an elastic modulus preferably of 2.5 GPa or more, and more preferably of 3.4 GPa or more. If the elastic modulus is 2.5 GPa or more, preferably 3.4 GPa or more, it is possible to prevent the damage of the film that would be caused due to film shrinkage during the heat treatment. This makes it possible to obtain a graphite excellent in various properties.

The elastic modulus of the film may be measured according to ASTM-D-882. The elastic modulus of polyimide film is more preferably 3.0 GPa or more, preferably 4.0 GPa or more, and further preferably 5.0 GPa or more. If the film had an elastic modulus of less than 2.5 GPa, the film shrinkage would likely occur during the heat treatment, thereby damaging and deforming the film. A resultant graphite would not so excellent in crystallinity, density, and heat conductivity.

The water absorption of the film was measured as follows. From a film dried at 100° C. for 30 min to complete dehydration, a sample of 10 cm×10 cm with 20 μm thickness was prepared and weighted, thereby obtaining weight A1. Then, the sample of 10 cm×10 cm with 20 μm thickness was immersed in distilled water of 23° C. for 24 hours. After wiping off the water therefrom, the sample was weighted immediately, thereby obtaining weight A2. The water absorption was calculated out from the following equation.

Water absorption(%)=(A2−A1)÷A1×100.

<Preparation Method of Polyimide Film>

The polyimide film for use in the present invention may be prepared as follows: an organic solvent of a polyamide acid, which is a precursor of the polyimide, is mixed with an imidation promoter; a mixture thus prepared is cast on a supporter such as endless belt, stainless drum, or the like; the mixture is then dried and sintered for imidation.

The preparation of the polyamide acid for use in the present invention may be carried out by a well-known method. In general, at least one aromatic acid dianhydride and at least one diamine are dissolved in an organic solvent in substantially equimolar amounts. A organic solution thus prepared is stirred under a controlled temperature until the polymerization of the acid dianhydride and diamine is completed. In this way, the polyamide acid may be prepared. Such a polyamide acid solution generally has a concentration of 5 to 35 wt %, preferably 10 to 30 wt %. The polyamide acid solution having a concentration within these ranges can have an appropriate molecular weight and solution viscosity.

The polymerization may be carried out by any of well-known methods. For example, the following polymerization methods (1) to (5) are preferable.

(1) An aromatic diamine is dissolved in an organic polar solvent. A solution thus prepared is reacted with an aromatic tetracarboxylic dianhydride of a substantially equimolar amount with the aromatic diamine in order to carry out the polymerization.

(2) An aromatic tetracarboxylic dianhydride is reacted with an aromatic diamine compound in an organic polar solvent. The amount of the aromatic diamine compound is less in molar amount than the aromatic tetracarboxylic dianhydride. The reaction produces a prepolymer having an acid anhydride group at each terminal. Subsequently, the prepolymer is reacted with an aromatic diamine compound in such an amount that the aromatic diamine compound and the aromatic tetracarboxylic dianhydride used are in equimolar amounts after all.

This method is similar to the method recited in Claim 17 in which a prepolymer having an acid dianhydride at each terminal is synthesized from a diamine and the acid dianhydride, and then reacted with another diamine thereby to synthesize a polyamide acid.

(3) A prepolymer having an amino group at each terminal is obtained by reacting an aromatic tetracarboxylic dianhydride and an aromatic diamine compound in an organic polar solvent. The aromatic diamine compound is excess in molar amount than the aromatic tetracarboxylic dianhydride. After the aromatic diamine compound is further added to the prepolymer subsequently, the prepolymer with the aromatic diamine compound is polymerized with the aromatic tetracarboxylic dianhydride is in such an amount that the aromatic tetracarboxylic acid dianhydride and the aromatic diamine compound are in substantially equimolar amounts.

(4) An aromatic tetracarboxylic dianhydride is dissolved and/or dispersed in an organic polar solvent, and then polymerized with an aromatic diamine compound of a substantially equimolar amount with respect to the aromatic tetracarboxylic dianhydride.

(5) A mixture of an aromatic tetracarboxylic dianhydride and an aromatic diamine of substantially equimolar amounts are polymerized in an organic polar solvent.

Among these methods, the polymerization methods (2) and (3) in which sequential control via prepolymer is carried out are preferable. The "sequential control" controls the combination/bonding of block polymers. These polymerization methods (2) and (3) makes it easy to obtain a polyimide having a large birefringence and a small linear expansion coefficient. From the heat treatment of such a polyimide film, it is easy to obtain a graphite having a high crystallinity and excellent density and heat conductivity. Moreover, it is predicted that well-controlled polymerization leads to more overlapping of the aromatic rings, which facilitates the graphitization even in heat treatment with a low temperature. Moreover, a higher imide group content for attaining higher birefringence results in lower carbon ratio in the resin, thereby reducing carbonization yield after the graphitization. The polyimide film thus synthesized via the sequential control is preferable, because it can have a high birefringence without sacrificing the carbon ratio in the resin.

Examples of the acid dianhydride for use in the synthesis of the polyimide in the present invention include pyromellitic dianhydride, 2,3,6,7-naphthalenetetracarboxylic dianhydride, 3,3',4,4'-biphenyltetracarboxylic dianhydride, 1,2,5,6-naphthalenetetracarboxylic dianhydride, 2,2',3,3'-biphenyltetracarboxylic dianhydride, 3,3',4,4'-benzophenonetetracarboxylic dianhydride, 2,2-bis(3,4-dicarboxyphenyl)propane dianhydride, 3,4,9,10-perylenetetracarboxylic dianhydride, bis(3,4-dicarboxyphenyl)propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)ethane dianhydride, oxydiphthalic dianhydride, bis(3,4-dicarboxyphenyl)sulfone dianhydride, p-phenylenebis(trimellitic monoester anhydride), ethylenebis(trimellitic monoester anhydride), bis phenol A bis(trimellitic monoester anhydride), and the like compounds. These acid dianhydrides may be used solely or in combination in any mixing ratio.

Examples of the diamine for use in the synthesis of the polyimide in the present invention include 4,4'-oxydianilline, p-phenylenediamine, 4,4'-diaminodiphenylpropane, 4,4'-diaminodiphenylmethane, benzidine, 3,3'-dichlorobenzidine, 4,4'-diaminodiphenylsulfide, 3,3'-diaminodiphenylsulfone, 4,4'-diaminodiphenylsulfone, 4,4'-diaminodiphenylether(4,4'-oxydianilline), 3,3'-diaminodiphenylether(3,3'-oxydianilline), 3,4'-diaminodiphenylether(3,4'-oxydianilline), 1,5-diaminonaphthalene, 4,4'-diaminodiphenyldiethylsilane, 4,4'-diaminodiphenylsilane, 4,4'-diaminodiphenylethyl phosphine oxide, 4,4'-diaminodiphenyl N-methylamine, 4,4'-diaminodiphenyl N-phenylamine, 1,4-diaminobenzene (p-phenylenediamine), 1,3-diaminobenzene, 1,2-diaminobenzene, and the like compounds. These diamine may be used solely or in combination in any mixing ratio.

Especially for a smaller linear expansion coefficient, a higher elastic modulus, a greater birefringence, the acid dianhydride represented by the following formula is preferably used as a raw material in the production of the polyimide film in the present invention.

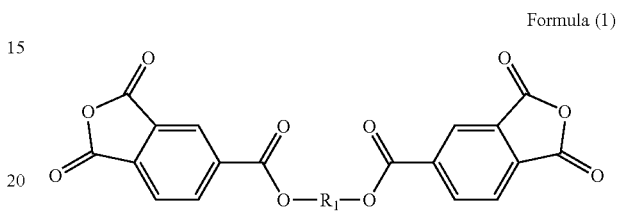

Formula (1)

where $R_1$ is a divalent organic group selected from the group consisting of the divalent organic groups represented by Formulae (2) to (14) respectively:

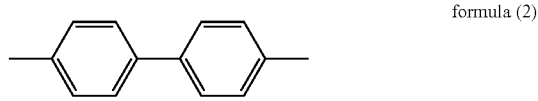

formula (2)

formula (3)

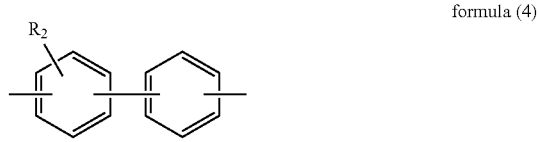

formula (4)

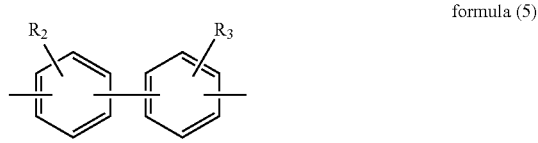

formula (5)

formula (6)

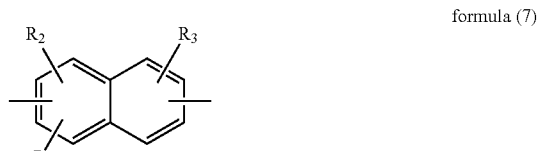

formula (7)

formula (8)

-continued

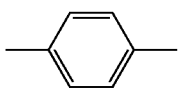
formula (9)

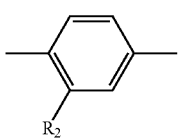
formula (10)

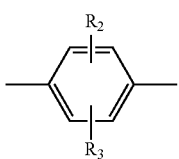
formula (11)

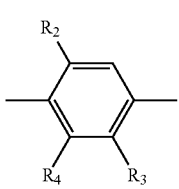
formula (12)

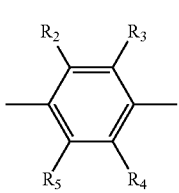
formula (13)

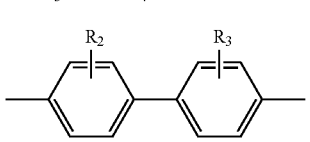
formula (14)

where $R_2$, $R_3$, $R_4$, and $R_5$ are independently any one selected from the group consisting of —$CH_3$, —Cl, —Br, —F, and —$OCH_3$.

The use of the acid anhydride makes it possible to obtain a polyimide film having a relatively low water absorption. This is preferable because foaming due to water content can be prevented by this during the graphitization.

Especially, the acid dianhydride whose $R_1$ is an organic group having a benzene ring, such as the organic groups represented by Formulae (2) to (14) is preferable especially because molecules are highly aligned in a polyimide film prepared therefrom, and the polyimide film has a small linear expansion coefficient, a large elastic modulus, a great birefringence, and a low water absorption.

For a smaller linear expansion coefficient, a larger elastic modulus, a greater birefringence, and a lower water absorption, an acid anhydride represented by Formula (15) is preferable as a raw material of the synthesis of the polyimide in the present invention:

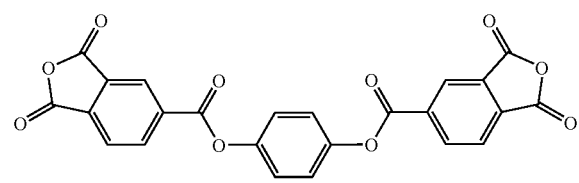
Formula (15)

Especially, a polyimide film prepared from an acid anhydride having such a structure that benzene rings are straightly linked via two or more ester bonds, has a conformation that is likely straight as a whole even though it includes a bending chain. Thus, such a polyimide film is relatively rigid. As a result, the polyimide film prepared from such a raw material can have a smaller linear expansion coefficient, for example, $1.5 \times 10^{-5}/°$ C. or less. Moreover, such a polyimide film can have an elastic modulus increased to 500 kg f/mm² or more, and a water absorption reduced to 1.5% or less.

For attaining a further smaller linear expansion coefficient, a further larger elastic modulus, and a further greater birefringence, it is preferable that the polyimide be synthesized using p-phenylenediamine as a raw material in the present invention.

Moreover, the most appropriate diamines for use in the synthesis of the polyimide in the present invention are 4,4'-oxydianilline and p-phenylene dianilline. It is preferable that one or both of these diamines be used by 40 mol % or more in sum with respect to the total diamine. It is more preferable that one or both of these diamines be used by 50 mol % or more in sum with respect to the total diamine. It is further preferable that one or both of these diamines be used by 70 mol % or more in sum with respect to the total diamine. It is even more preferable that one or both of these diamines be used by 80 mol % or more in sum with respect to the total diamine. Moreover, it is preferable that p-phenylenediamine be used by 10 mol % or more. It is more preferable that p-phenylenediamine be used by 20 mol % or more. It is further preferable that p-phenylenediamine be used by 30 mol % or more. It is even more preferable that p-phenylenediamine be used by 40 mol % or more. When content of these diamine is less than the lower limits of the mol % ranges, the resultant polyimide film tends to have a larger linear expansion coefficient, a smaller elastic modulus, and a smaller birefringence. However, if all the diamine is p-phenylenediamine, it becomes difficult to have a thick polyimide film in which foaming is not significant. Thus, it is good to use 4,4'-oxydianilline.

The most appropriate acid dianhydrides for use in the synthesis of the polyimide film in the present invention are pyromellitic dianhydride and/or p-phenylenebis(trimellitic monoester anhydride) represented by Formula (15). It is preferable that one or both of these acid dianhydrides is used by 40 mol % or more in sum with respect to the total acid dianhydride. It is more preferable that one or both of these acid dianhydrides is used by 50 mol % or more in sum with respect to the total acid dianhydride. It is further preferable that one or both of these acid dianhydrides is used by 70 mol % or more in sum with respect to the total acid dianhydride. It is even more preferable that one or both of these acid dianhydrides is used by 80 mol % or more in sum with respect to the total acid dianhydride. When the amount of these acid dianhydrides is less than 40 mol %, the resultant polyimide film tends to have a larger linear expansion coefficient, a smaller elastic modulus, and a smaller birefringence.

An additive such as carbon black, graphite or the like may be added to the polyimide film, polyamide acid, or the polyimide resin.

As the solvent for the synthesis of the polyamide acid, amide-based solvents such as N,N-dimethylformamide, N,N-dimethylacetoamide, N-methyl-2-pyrrolidone, and the like. N,N-dimethylformamide and N,N-dimethylacetoamide, are especially preferable.

Next, the polyimide may be prepared by a thermal curing method or a chemical curing method. In the thermal curing method, the polyamide acid, which is precursor, is thermally imidated. In the chemical curing method, the imidation of the polyamide acid is carried out by using (i) a dehydrating agent (typically an acid anhydride such as acetic anhydride) and/or (ii) an imidation promoter such as a tertiary amine (such as picoline, quinoline, isoquinoline, pyridine, or the like). Among them, the use of a compound having a high boiling point such as isoquinoline is preferable, because such a compound is not evaporated in an initial stage of the film production, and functions as a catalyst until the end of the drying. Especially, the chemical curing method is more preferable because the resultant film easily attain a small linear expansion coefficient, a high elastic modulus, and a larger birefringence, and the graphitization can promptly take place at a relatively lower temperature thereby to making it possible to attain a graphite of good quality. Especially, the use of the dehydrator and the imidation promoter in combination is preferable because the resultant film will have a smaller linear expansion coefficient, a greater elastic modulus, and a greater birefringence. Moreover, the chemical curing method is industrially advantageous and allows excellent productivity because the chemical curing method allows faster imidation, thereby making it possible to finish, in a short time, the imidation reaction in the heating treatment.

Specifically, a production of the film by using the chemical curing is carried out as follows: Firstly, an imidation prompter and a dehydrator in stoichiometrically-excessive amounts are added into a polyamide acid solution. The imidation promoter contains a catalyst. Then, the polyamide acid solution is cast or applied on a supporter such as a supporting board, an organic film (such as PET or the like), drum or an endless belt. Thereby, a film of the polyamide acid solution is formed on the supporter. The organic solvent is then evaporated off to obtain a self-supportable film. The self-supportable film is further heated for imidating and drying it simultaneously, thereby to obtain a polyimide film. The heating is carried out in a temperature range from 150° C. to 550° C., preferably. There is no particular limitation as to the heating rate. However, it is preferable that the temperature be gradually increased continuously or in a step-wise manner to a maximum temperature that is within the prescribed temperature range. The heating is continued for various duration depending on the film thickness and the maximum temperature. In general, it is preferable that maximum temperature be kept for 10 second to 10 minutes in the heating. Further, it is preferable that the production of the polyimide film include the step(s) of holding and spreading/extending the film in order to prevent the film from shrinkage. This tends to give the resultant film a small linear expansion coefficient, a high elastic modulus, and a large birefringence.

<Graphitization of Raw Material Film Including Polyimide Film>

In the graphitization, carbonization and then conversion to the graphite structure are carried out by the heat treatment. For this, carbon-carbon bonds should be cleaved and rebonded. It is necessary that the cleavage and rebonding occur with an energy as low as possible to cause the graphitization as easy as possible. Alignment of the carbon atoms in the carbonized film is influenced from the molecular alignment of the starting raw material film (such as the polymer films discussed above, especially, the polyimide film). The molecular alignment can reduce the energy necessary for the cleavage and rebonding of the carbon-carbon bonds in the graphitization. Therefore, by appropriately designing the molecular structure in which the molecules are highly aligned, it is possible to attain graphitization with a relatively low temperature. Molecular alignment in which the molecules are aligned 2-dimensionally in parallel with the film surface is more effective.

Secondly, the graphitization reaction is difficult to proceed at a low temperature if the raw material film is thick. Therefore, graphitization of a thick raw material film would possibly result in that the inside of the film has not been converted into the graphite structure while the surface layer of the film has been graphitized already. The molecular alignment of the raw material film promotes the graphitization of the inside of the film, thereby making it possible to attain a graphite of good quality with a low temperature as a result.

Simultaneous graphitization of the surface layer and inside of the raw material film is effective to prevent the graphite structure of the surface layer from being damaged by the gas generated in the inside of the film. This makes it possible to graphitize a thicker film. The raw material film (such as the polymer films discussed above, especially the polyimide film) prepared in the present invention has molecular alignment that is most suitable for such an effect.

<Thickness of Graphite Film>

The graphite film prepared by the production method of the present invention is 20 μm or more, preferably 50 μm or more, and further preferably 90 μm or more in thickness. Especially, a thickness of 90 μm or more gives a great amount of heat transport, which makes it easier to carry heat away from an apparatus that generates heat. This makes it possible to prevent temperature increase.

<Heat Diffusivity of Graphite Film>

The graphite film prepared by the production method of the present invention is $5.0 \times 10^{-4}$ m$^2$/S or more, preferably $8.0 \times 10^{-4}$ m$^2$/S or more, and further preferably $9.0 \times 10^{-4}$ m$^2$/S or more. A heat diffusivity of $5.0 \times 10^{-4}$ m$^2$/S or more give such a high heat conductivity that makes it easier to carry heat away from an apparatus that generates heat. This makes it possible to prevent temperature increase in the heat-generating apparatus. On the other hand, a heat diffusivity of less than $5.0 \times 10^{-4}$ m$^2$/S gives such a poor heat conductivity that makes it impossible to carry heat away from the apparatus that generate heat. This makes it impossible to prevent temperature increase in the heat-generating apparatus.

As later described in Examples of the present inventions, a graphite film having a thickness of 90 μm or more and a heat diffusivity of $8.0 \times 10^{-4}$ m$^2$/S or more was attained (when the raw material film was 225 μm in thickness).

According to the production method of the present invention including applying a voltage on the raw material film in order to electrify the raw material film and to cause the raw material film to generate heat, it is possible to attain a graphite having more excellent heat conductivity than a conventional one. Moreover, the production method of the present invention makes it possible to graphitize a thick film that is conventionally difficult to graphitize. More specifically, it is possible to graphitize a film of, for example, the order of 125 μm, 175 μm, 200 μm, 225 μm into a graphite of good quality by appropriately choosing heat treatment as appropriate.

<Usage Etc.>

The graphite film produced by the production method according to the present invention has a high heat conductivity and a high electric conductivity. Therefore, the graphite film is suitably applicable to the followings, for example: electronic apparatuses such as servers, personal computers for use as a server, desktop personal computers, etc.; portable electronic apparatuses such as notebook personal computers, electronic dictionaries, PDAs, portable telephones, portable music players, etc.; a display apparatuses such as liquid crystal display apparatuses, plasma display apparatuses, LEDs, organic ELs, inorganic ELs, liquid crystal projectors, watches/clocks etc.; imaging apparatuses such as inkjet printers (ink heads), electronic photographic apparatus (developing apparatus, fixing apparatus, heat roller, heat belt), etc.; semiconductor-related parts such as semiconductor devices, semiconductor packages, semiconductor sealing cases, semiconductor die bonding, CPUs, memories, power transistors, power transistor cases etc.; wired boards such as rigid wired boards, flexible wired boards, ceramic wired boards, build-up wired boards, lamination substrates, etc. (the wired board encompasses a printed wired board); manufacturing apparatuses such as vacuuming apparatuses, semiconductor manufacturing apparatuses, display apparatus manufacturing apparatuses, etc.; heat insulating apparatuses such as heat insulating material, vacuum heat insulating material, radiation heat insulating material etc.; data recording apparatuses such as DVDs (light pickup, laser generating apparatus, laser receiving apparatus), hard disc drives, etc; image recording apparatuses such as cameras, video cameras, digital cameras, digital video cameras, microscopes, CCDs, etc., heat-radiating apparatuses for battery apparatuses (such as charging apparatuses, lithium cells, fuel cells) such as heat-radiating materials, heat-radiating parts, cooling parts, heat controlling parts, electromagnetic shielding parts.

<Usage Etc.>

The graphite film of the present invention may be used in such a manner that a resin layer, a ceramic layer, a metal layer, an insulating layer, a conductive layer may is formed on one or each side of the graphite film, for more firmly adhering the graphite film to a heat radiator, a heat sink, a heat pipe, water-cooling cooler, peltier device, a housing, or hinge, or for better heat diffusivity, better heat radiating property, and easier handling.

The following describes various Examples according to the present invention and several Comparative Examples.

EXAMPLES

Method for Manufacturing Polyimide Film A

Pyromellitic acid dianhydride of 1 equivalent was dissolved to a DMF (dimethylformamide) solution in which 4,4'-oxydianiline of 1 equivalent was dissolved, thereby obtaining a polyamide acid solution (18.5 wt %).

While the solution was cooled down, acetic anhydride, isoquinoline, and a catalyst for imidation were added and degassed. Each amount of the added acetic anhydride and isoquinoline was 1 equivalent relative to carboxylic acid groups contained in the polyamide acid, and the catalyst includes DMF. The mixed solution was then applied on aluminum foil, so as to have a predetermined thickness after being dried. The layer of the mixed solution on the aluminum foil was dried using a hot air oven and a far-infrared radiation heater.

The following describes drying conditions for manufacturing a film having a thickness of 75 μm. The layer of the mixed solution on the aluminum foil was dried using the hot air oven at a temperature of 120° C. for 240 seconds and became a gel film being self-supportable. The gel film was peeled from the aluminum foil and fixed to a frame. Further, the gel film was heated and dried stepwise using the hot air oven at a temperature of 120° C. for 30 seconds, at a temperature of 75° C. for 40 seconds, at a temperature of 400° C. for 43 seconds, at a temperature of 450° C. for 50 seconds, and then heated using the far-infrared radiation heater at a temperature of 460° C. for 23 seconds.

As such, the polyimide films having thicknesses of 25 μm, 50 μm, 75 μm, 125 μm, and 225 μm (polyimide films A having a elastic modulus of 3.1 GPa, a water absorption of 2.5%, a birefringence of 0.10, and a linear expansion coefficient of $3.0 \times 10^{-5}$/° C. were manufactured. Note that, films having a thickness other than these were manufactured by adjusting their baking times in proportion to their thickness. For example, when a film having a thickness of 225 μm was manufactured, its baking time was set to three times longer than that of a film having a thickness of 75 μm. In the case of a film having a large thickness, the baking needs to be carried out at a low temperature for a sufficient time in order to prevent foaming due to evaporation of (i) a solvent in a polyimide film and/or (ii) a catalyst for imidation.

For actual graphitization, polyimide films, Apical AH (made by Kaneka Co., Ltd.) were used. The polyimide films were manufactured by the same method as specified above and had thicknesses of 25 μm, 50 μm, 70 μm, 125 μm, and 225 μm.

Method for Manufacturing Polyimide Film B

Pyromellitic acid dianhydride of 2 equivalents was dissolved to a DMF (dimethylformamide) solution in which 4,4'-oxydianiline of 1 equivalent and p-phenylenediamine of 1 equivalent were dissolved, and a polyamide acid was obtained. Other steps were carried out as in Example 1, except that the polyamide acid thus obtained was used. As a result, polyimide films having thicknesses of 25 μm, 50 μm, 75 μm, 125 μm, and 225 μm (polyimide films B having a elastic modulus of 4.9 GPa, an water absorption of 3.0%, a birefringence of 0.14, and a linear expansion coefficient of $1.5 \times 10^{-5}$/° C.) were manufactured.

Method for Manufacturing Polyimide Film C

Pyromellitic acid dianhydride of 4 equivalents was dissolved to a DMF solution in which 4,4'-oxydianiline of 3 equivalents was dissolved, and, a polyamide acid was obtained. Then, a prepolymer having an anhydride at each terminal was synthesized. Then, the same steps as in manufacturing the polyimide films A were carried out, except that a polyamide acid obtained by dissolving p-phenylenediamine of 1 equivalent to a solution containing the prepolymer was used. As a result, polyimide films having thicknesses of 25 μm, 50 μm, 75 μm, 125 μm, and 225 μm (polyimide films C having a elastic modulus of 4.1 GPa, an water absorption of 2.1%, a birefringence of 0.14, and a linear expansion coefficient of $1.6 \times 10^{-5}$/° C.) were manufactured.

For actual graphitization, polyimide films, Apical NPI (made by Kaneka Co., Ltd) were used. The polyimide films were manufactured by the same method as specified above and had thicknesses of 25 μm, 50 μm, 75 μm, 125 μm, and 225 μm.

Method for Manufacturing Polyimide Film D

Pyromellitic acid dianhydride of 1 equivalent was dissolved to a DMF (dimethylformamide) solution in which 4,4'-oxydianiline of 1 equivalent was dissolved, and a polyamide acid solution was obtained. The polyamide acid solution, which used the polyamide acid and in which no catalyst was added, was then applied on aluminum foil so as to have a predetermined thickness after being dried. The layer of the mixed solution on the aluminum foil was dried using the hot air oven at a temperature of 120° C. for 10 minutes and became a gel film being self-supportable. The gel film was peeled from the aluminum foil and fixed to a frame. Further, the gel film was dried using the hot air oven for 1 hour by increasing a temperature from 120° C. to 400° C. As a result, polyimide films having a thickness of 25, 50, 75, 125, or 225 μm (polyimide films D having a elastic modulus of 2.9 GPa, an water absorption of 2.5%, a birefringence of 0.08, and a liner expansion coefficient of $3.5 \times 10^{-5}$/° C.) were manufactured.

Example 1

Each polyimide film A was sandwiched between graphite plates and heated in an electric furnace under nitrogen atmosphere by increasing a temperature up to 1000° C. The heat treatment was then carried out at a temperature of 1000° C. for 1 hour, and films were carbonized. These carbonized films are referred to as carbonized films A'.

The obtained carbonized films A' sandwiched between the flat and smooth graphite plates having a shape of 6 cm×width 6 cm×thickness of 5 mm were held in a graphite vessel having the shape of a rectangular solid. The vessel including the carbonized films A' was then covered by carbon powder essentially consisting of coke, and heated by directly electrifying the entire vessel and carbon powder to heat the film up to 3000° C., not by heat application under atmosphere. As such, graphite films were manufactured.

Example 2

Polyimide films B were used. As in Example 1, graphite films were manufactured by carbonizing the polyimide films B and then electrifying the carbonized films B'.

Example 3

Polyimide films C were used. As in Example 1, graphite films were manufactured by carbonizing the polyimide films C and then electrifying the carbonized films C'.

Example 4

The carbonized films A' obtained in Example 1 were held in a graphite vessel and heated by directly electrifying the vessel to heat the film up to 3000° C. As such, graphite films were manufactured.

Example 5

The carbonized films C' obtained in Example 3 were held in a graphite vessel. Then, the vessel was directly electrified to heat the film up to 3000° C. As such, graphite films were manufactured.

Example 6

The polyimide films A obtained in Example 1 were held in a graphite vessel and the vessel was covered with carbon powder. Then, the vessel and the carbon powder were entirely electrified to heat the film up to 3000° C. As such, graphite films were manufactured.

Example 7

The polyimide films C obtained in Example 3 were held in a graphite vessel and the vessel was covered with carbon powder. Then, the vessel and the carbon powder were entirely electrified to heat the film up to 3000° C. As such, graphite films were manufactured.

Comparative Example 1

Each of the polyimide films A obtained in Example 1 was sandwiched between graphite plates and carbonized. The carbonization was carried out using an ultra-high temperature furnace having a graphite heater by increasing a temperature up to 1000° C. under reduced pressure. The films were further heated by increasing the temperature up to 3000° C. under argon atmosphere with a reduced pressure of 0.09 MPa using the ultra-high temperature furnace, and held at the highest temperature for 1 hour. The films were then cooled down, and graphite films were obtained.

Table 1 shows thermal diffusivities of the films obtained in Examples 1 to 7 and in Comparative Example 1.

TABLE 1

|  |  | Example 1 | Example 2 | Example 3 | Example 4 | Example 5 | Example 6 | Example 7 | Comparative Example 1 |
|---|---|---|---|---|---|---|---|---|---|
| Birefringence of raw material film (*1) | | 0.10 | 0.14 | 0.14 | 0.10 | 0.14 | 0.10 | 0.14 | 0.10 |
| Strength of raw material film (kgf/mm²) (*1) | | 320 | 500 | 420 | 320 | 420 | 320 | 420 | 320 |
| Linear expansion coefficient of raw material film ($\times 10^{-5}$/° C.) (*1) | | 3.0 | 1.5 | 1.6 | 3.0 | 1.6 | 3.0 | 1.6 | 3.0 |
| Thermal diffusivity of graphite film ($\times 10^{-4}$ m²/S) (*2) | Raw material film having thickness of 25 μm (*1) | 9.5 | 10.0 | 10.6 | 9.2 | 10.5 | 9.6 | 10.8 | 8.7 |
| | Raw material film having thickness of 50 μm (*1) | 9.3 | 9.8 | 10.4 | 9.1 | 10.3 | 9.5 | 10.5 | 8.4 |
| | Raw material film having thickness of 75 μm (*1) | 9.1 | 9.4 | 10.3 | 8.9 | 10.2 | 9.2 | 10.4 | 6.5 |
| | Raw material film having thickness of 125 μm (*1) | 8.5 | 8.7 | 10.2 | 8.2 | 10.1 | 8.6 | 10.3 | 4.8 |
| | Raw material film having thickness of 225 μm (*1) | 8.1 | 8.5 | 10.2 | 8.0 | 10.0 | 8.2 | 10.3 | BREAK |
| Thickness of graphite film (μm) (*2) | Raw material film having thickness of 25 μm (*1) | 12 | 11 | 11 | 12 | 11 | 11 | 10 | 12 |
| | Raw material film having thickness of 50 μm (*1) | 24 | 23 | 22 | 25 | 22 | 23 | 21 | 24 |
| | Raw material film having thickness of 75 μm (*1) | 36 | 34 | 32 | 37 | 32 | 35 | 31 | 37 |

TABLE 1-continued

|  | Example 1 | Example 2 | Example 3 | Example 4 | Example 5 | Example 6 | Example 7 | Comparative Example 1 |
|---|---|---|---|---|---|---|---|---|
| Raw material film having thickness of 125 μm (*1) | 59 | 57 | 52 | 60 | 51 | 58 | 50 | 63 |
| Raw material film having thickness of 225 μm (*1) | 105 | 99 | 94 | 106 | 94 | 104 | 93 | BREAK |

(*1) Thicknesses of raw materials indicate thicknesses of polyimide films before carbonization, i.e., thicknesses of films that were not carbonized yet.
(*2) Graphite film as used herein refers to graphite films obtained in Examples and Comparative Example.

The progress of the graphitization was determined by measuring a thermal diffusivity in an in-plane direction of a film. It is shown that the higher the thermal diffusivity was, the more significant the graphitization was. The thermal diffusivities were measured using a thermal diffusivity measurement device using Hikari-Koryu method ("LaserPit" available from Albuc Riko Co., Ltd.) at a temperature of 20° C. and at 10 Hz.

The thermal diffusivities indicate that all the graphite films obtained in Examples 1 to 7 had a high heat conductivity of not less than $8.0 \times 10^{-4}$ m$^2$/S. The thinner the material was, the higher heat conductivity the films tended to achieve. However, even films having the largest thickness (225 μm) had a thermal diffusivity of $8.0 \times 10^{-4}$ m$^2$/S and were sufficiently graphitized even though the thickness of the raw material film was thicker than 25 μm or 50 μm, etc. In Examples 1 to 7, raw material films were held in vessels capable of being directly electrified with application of voltage. Then, the graphitization was carried out by applying voltage to the vessels to electrify the vessels. This electrifies the raw material films and thereby causing the raw material films to generate heat, which facilitates heating surfaces and inside portion of the films uniformly. Further, the films were sufficiently heated also from the surroundings of the films. This is considered to be a reason that the graphite films obtained in Examples 1 to 7 had more excellent electrical and heat conductivity, compared with conventional films. Further, in the case of the raw material films having thicknesses ranging from about 125 μm to about 225 μm, which were thicker than those of conventional films, the films were uniformly heated from the inside portion, surfaces, and surroundings of the film. This caused both the surfaces and inside portion of the film to be graphitized concurrently. As a result, no graphitized layer was formed which prevented generation of decomposition gas on the surface layer, allowing the inner decomposition gas to be discharged easily. This is considered to be a factor for achieving graphite films that did not break due to the decomposition gas and that had excellent electric and heat conductivity.

On the other hand, the thermal diffusivity of the graphite films obtained in Comparative Example 1 was reduced, as the polyimide films A had a larger thickness. When polyimide films having the largest thickness of 225 μm were used as starting material, the films were broken after the heat treatment. In Comparative Example 1, since the heat treatment was carried out under inert gas atmosphere and reduced pressure, (i) a portion where the films came in contact with the heater and (ii) surfaces of the raw material films were first heated. Specifically, the surfaces were heated depending on the heat conduction of the gas and the radiation heat applied by the heater. As a result, the inside portion and surfaces of each film were not uniformly graphitized, and the heat conductivity of the film as a whole was reduced. Particularly, when the raw material films had a large thickness, the graphitization was started from the surfaces of each film and therefore the gas was not easily discharged from the inside portion of the film. Thus, it is considered that the films were broken because the decomposition gas was discharged compulsorily.

The graphite films obtained in Examples 1, 2, and 3 exhibited excellent properties, which were greater in this order. One reason why the graphite films obtained in Examples 2 and 3 were more excellent than those obtained in example 1 would be that the plane orientations of stating materials of the films in Examples 2 and 3 were higher than that of the films in Example 1. Further, one of the reasons why the films in Example 3 was more excellent than those in Example 3 is considered that the starting material of the films in Example 3 was manufactured by sequence control on starting materials. That is, the molecules of the material were easily rearranged during graphitization. Another reason would be that less decomposition gas was generated and the graphitization was carried out more smoothly in the films in Example 3. This is because, generally, the more highly the molecules of the starting material are aligned in plane, the higher the carbon ratio. It is considered that, with the same reason, the films obtained in Example 5 were more excellent than those obtained in Example 4 and the films obtained in Example 7 were more excellent than those obtained in Example 6.

Further, another reason why the film obtained in Example 1 was more excellent than one obtained in Examples 4 the film obtained in Example 31 was more excellent than one obtained in Examples 5 is considered as follows. In Examples 1 and 3, the films were electrified through carbon powder covering vessels, not by directly electrifying the vessels. This caused the films to be graphitized uniformly, and graphites having high quality were manufactured.

One reason why the films obtained in Example 6 and 7 were more excellent than those obtained in Example 1 and 3, respectively, is considered as follows. In Examples 6 and 7, polyimide films were used as starting films and were heated as a result of the electrification that proceeds according to carbonization. This caused the films to be graphitized uniformly, and graphites having high quality were manufactured.

As shown in Table 1, the graphite films obtained in Examples 1 to 7 had thicknesses of 40% to 50% of the thicknesses of their starting materials, respectively. That is, it was confirmed that those films were sufficiently graphitized. Note that the thicknesses of the films indicated in μm in Table 1 were obtained by measuring thicknesses of 10 films using a laser hologage and then calculating a mean value of the thicknesses. Further, the calculated values were rounded off in Table 1.

In Examples 1 to 7, from starting films having a thickness of 225 μm, graphite films were manufactured that had a thickness of not less than 90 μm and a thermal diffusivity of not less than $8.0 \times 10^{-4}$ m$^2$/S.

Example 8

Figure 8:
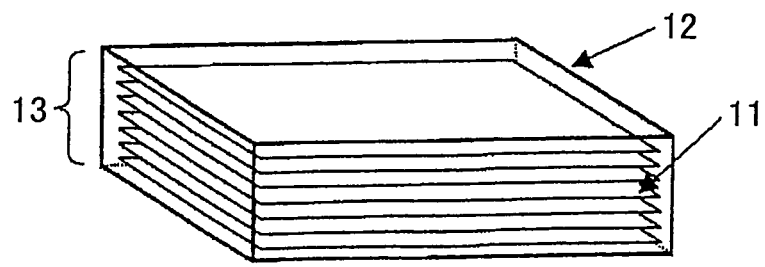
FIG. 8 illustrates how to hold raw material films in the vessel (A).
Figure 9:
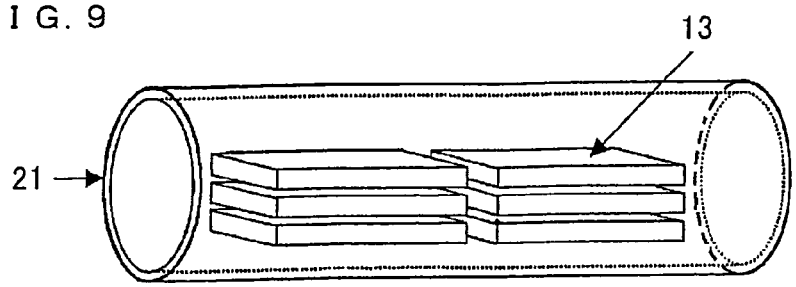
FIG. 9 is a schematic view illustrating how to hold the vessels (A) in the vessel (B).
Figure 10:
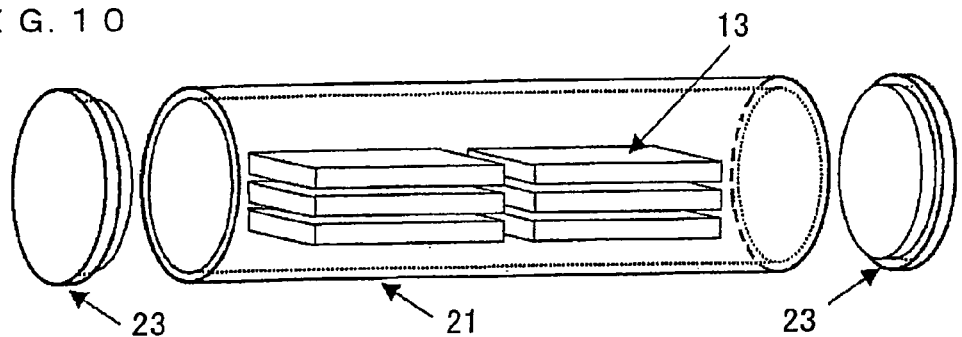
FIG. 10 is a schematic view illustrating how to hold the vessels (A) in the vessel (B).
Figure 11:
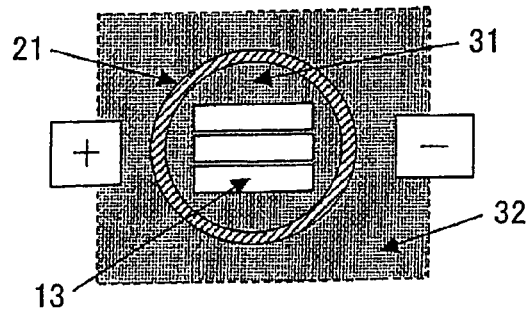
FIG. 11 illustrates how to hold the vessels (A) and vessel (B) and how in-plane directions of the raw material film and the direction of electrification are related with each other. Here, the straight line indication the direction of the electrification through the raw material film and a normal direction with respect to the plane of the raw material film make the right angle. The vessels (A) are separated from the vessel (B).

Carbonized films A' obtained through carbonization (polyimide films having a thickness of 75 μm and a shape of 100 cm² (length 100 mm×width 100 mm) were sandwiched between flat graphite plates being placed on and below each film and having a shape of length 150 mm×width 140 mm×thickness 4 mm. The films sandwiched between the graphite plates were then held in graphite vessels (vessels A), as shown in FIG. 8, which was directly electrified. Each graphite vessel (A) has a shape of length 180 mm×width 170 mm×thickness 60 mm. As schematically shown in FIG. 9, the vessels (A) were held such that the in-plane direction of the films became parallel to a direction along the height of a cylinder vessel (B), which was directly electrified (the cylinder vessel (B) was specifically a cylinder vessel (B) with caps as schematically shown in FIG. 10). Further, the outside of each vessel (A) was covered with carbon powder (the space between the vessel (A) and the vessel (B) was filled with carbon powder), and the vessels (A) were held so as not to contact the vessel (B) as shown in FIG. 11. Further, voltage was directly applied to the vessel (B) with its outside covered with the carbon powder as shown in FIG. 11. Specifically, voltage was applied to the vessel (B) in a direction along the diameter of the vessel (B) (i.e., in a direction parallel to the in-plane direction of the raw material films) and thereby the vessel (B) was electrified. In this way, the vessel (B) was heated up to a temperature of 3000° C., and graphite films were manufactured. The angle formed between a straight line indicating a direction in which the raw material films were electrified and normal line relative to the in-plane direction of the raw material films was 90° C.

Note that FIG. 10 is a view schematically illustrating the vessel (B) that was not closed with the caps yet. In this Example, even when the vessel (B) was closed with the caps, the vessel (B) was not kept airtight because expanded or contracted air was allowed to pass through a clearance between the caps and the vessel (B).

Note that, as in Example 8, the vessel (B) was used with the caps in the following Examples. That is, in the following Examples, the caps were used as in Example 8 (i.e., the caps were used, which allowed expanded or contracted air to pass through a gap between the caps and the vessel (B)).

However, for purpose of simplicity, the caps of the vessel (B) will not be illustrated in the following Examples.

Example 9

Graphite films were manufactured by performing the same steps as in Example 8, except that carbonized films B' (polyimide films having a thickness of 75 μm and a shape of 100 cm² (length 100 mm×width 100 mm) were used.

Example 10

Graphite films were manufactured by performing the same steps as in Example 8, except that carbonized films C' (polyimide films having a thickness of 75 μm and a shape of 100 cm² (length 100 mm×width 100 mm).

Example 11

Graphite films were manufactured by performing the same steps as in Example 8, except that carbonized films D' (polyimide films having a thickness of 75 μm and a shape of 100 cm² (length 100 mm×width 100 mm).

Example 12

Figure 12:
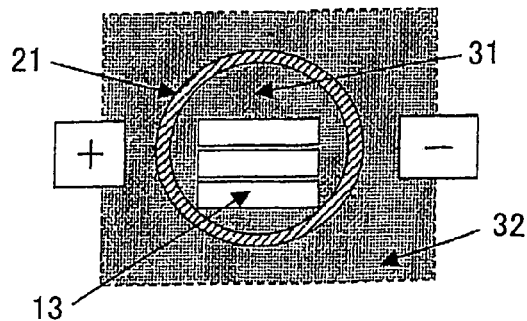
FIG. 12 illustrates how to hold the vessels (A) and vessel (B) and how in-plane directions of the raw material film and the direction of electrification are related with each other. Here, the straight line indication the direction of the electrification through the raw material film and the normal direction with respect to the plane of the raw material film make the right angle. The vessels (A) are in contact with the vessel (B).

Graphite films were manufactured by performing the same steps as in Example 8, except that the vessels (A) were held in the vessel (B) so as to contact the vessel (B) as shown in FIG. 12.

Example 13

Figure 13:
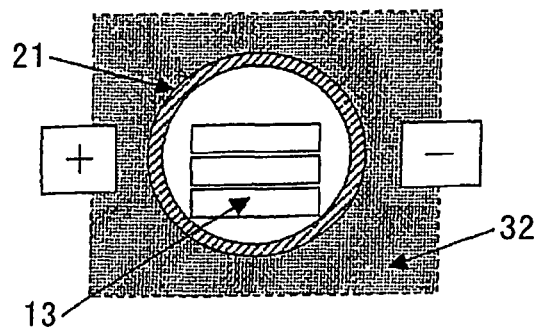
FIG. 13 illustrates how to hold the vessels (A) and vessel (B) and how in-plane directions of the raw material film and the direction of electrification are related with each other. Here, the straight line indication the direction of the electrification through the raw material film and the normal direction with respect to the plane of the raw material film make the right angle. The vessels (A) are in contact with the vessel (B).

Graphite films were manufactured by performing the same steps as in Example 12, except that nothing was filled in the space between the vessels (A) and the vessel (B), as shown in FIG. 13.

Example 14

Graphite films were manufactured by performing the same steps as in Example 8, except that an angle formed between a straight line indicating a direction in which material films were electrified and normal line relative to the in-plane direction of the material films was 45°.

Example 15

Figure 15:
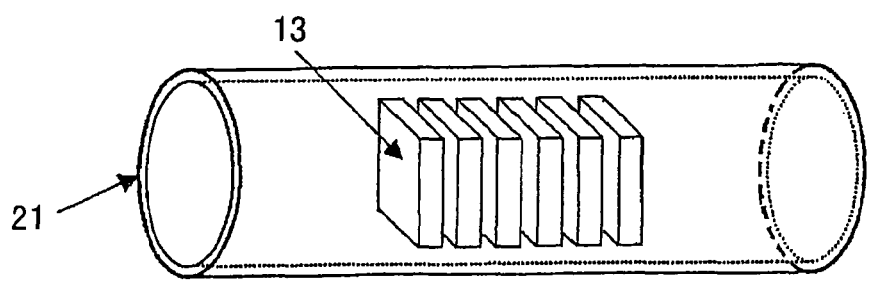
FIG. 15 is a schematic view illustrating how to hold the vessels (A) in the vessel (B).
Figure 16:
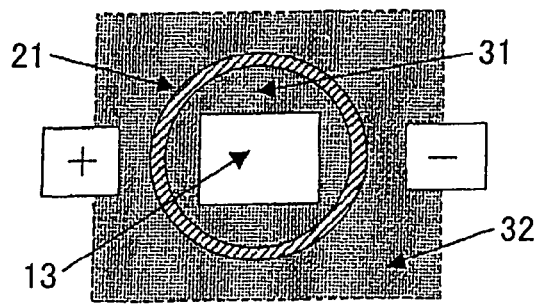
FIG. 16 illustrates how to hold the vessels (A) and vessel (B) and how in-plane directions of the raw material film and the direction of electrification are related with each other. Here, the straight line indication the direction of the electrification through the raw material film and the normal direction with respect to the plane of the raw material film make the right angle. The vessels (A) are separated from the vessel (B).

As in Example 8, carbonized films A' obtained through carbonization (i.e., raw material films) were held in the vessels (A) such that the in-plane direction of the raw material films became perpendicular to a direction along the height of the cylinder of the vessel (B), as shown in FIG. 15. Further, the outside of the vessel (A) was covered with carbon powder (the space between the vessels (A) and the vessel (B) was covered with carbon powder). The vessels (A) were held in the vessel (B) so as not to contact the vessel (B) as shown in FIG. 16. Then, the vessels (A) covered with the carbon powder as shown in FIG. 16 were electrified in a direction along the diameter of the vessel (B) (in a direction perpendicular to the in-plane direction of the raw material films). In this way, the films were heated up to a temperature of 3000° C., and thereby graphite films were manufactured. The angle formed between the straight line indicating a direction in which the raw material films were electrified and the normal line with respect to the in-plane direction of the raw material films was 90°.

Example 16

Figure 17:
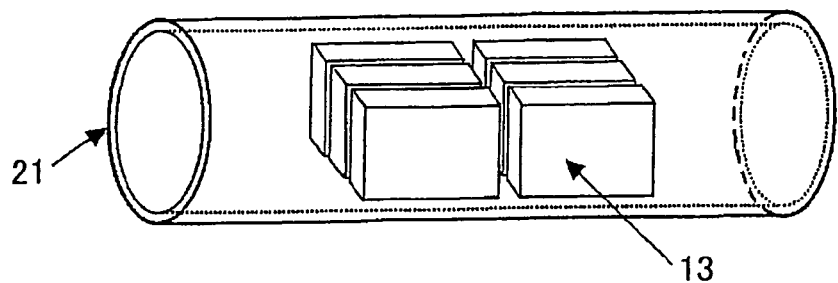
FIG. 17 is a schematic view illustrating how to hold the vessels (A) in the vessel (B).
Figure 18:
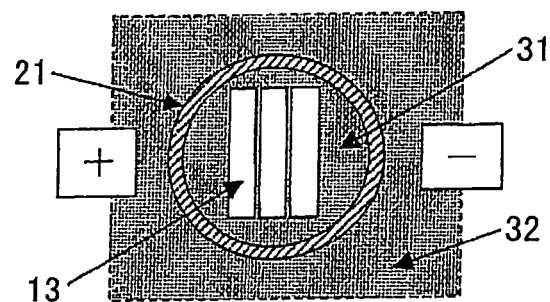
FIG. 18 illustrates how to hold the vessels (A) and vessel (B) and how in-plane directions of the raw material film and the direction of electrification are related with each other. Here, the straight line indication the direction of the electrification through the raw material film and the normal direction with respect to the plane of the raw material film make 0 degree. The vessels (A) are separated from the vessel (B).

As in Example 8, carbonized films A' obtained through carbonization (i.e., raw material films) were held in the vessels (A) such that the in-plane direction of the raw material films became perpendicular to a direction along the height of the cylinder of the vessel (B), as shown in FIG. 17. Further, the outside of the vessel (A) was covered with carbon powder (the space between the vessels (A) and the vessel (B) was covered with carbon powder). The vessels (A) were held in the vessel (B) so as not to contact the vessel (B) as shown in FIG. 18. Then, the vessels (A) covered with the carbon powder as shown in FIG. 18 were electrified in a direction along the diameter of the vessel (B) (in a direction perpendicular to the in-plane direction of the raw material films). In this way, the films were heated up to a temperature of 3000° C., and thereby graphite films were manufactured. The angle formed between the straight line indicating a direction in which the raw material films were electrified and the normal line with respect to the in-plane direction of the raw material films was 0°.

Example 17

Figure 19:
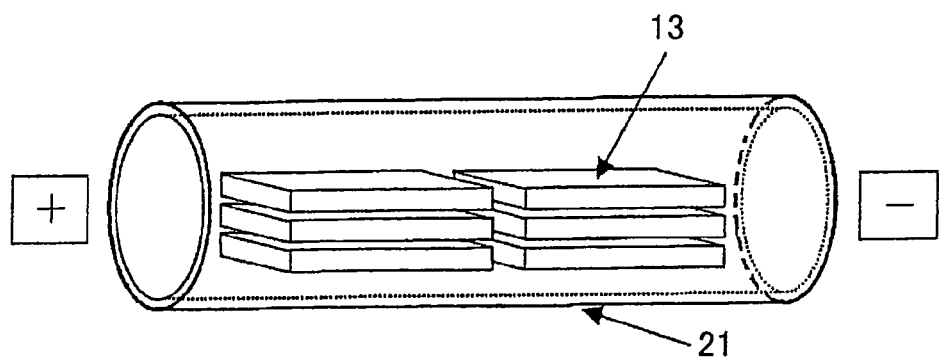
FIG. 19 is a schematic view illustrating how to hold the vessels (A) in the vessel (B).
Figure 20:
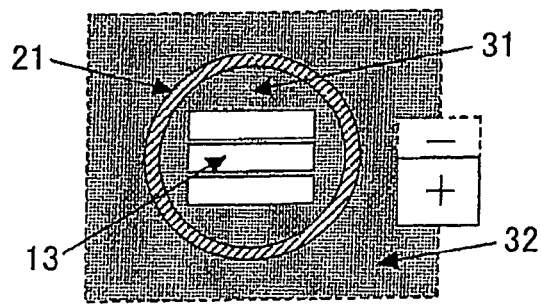
FIG. 20 illustrates how to hold the vessels (A) and vessel (B) and how in-plane directions of the raw material film and the direction of electrification are related with each other. Here, the straight line indication the direction of the electrification through the raw material film and the normal direction with respect to the plane of the raw material film make the right angle. The vessels (A) are separated from the vessel (B).

As in Example 8, carbonized films A' obtained through carbonization (i.e., raw material films) were held in vessels (A) such that the in-plane direction of the raw material films became parallel to a direction along the height of the cylinder of the vessel (B), as shown in FIG. 19. Further, the outside of the vessel (A) was covered with carbon powder (the space between the vessels (A) and the vessel (B) was filled with carbon powder). The vessels (A) were held in the vessel (B) so as not to contact the vessel (B) as shown in FIG. 20. Then, the vessels (B) covered with the carbon powder as shown in FIG. 20 were electrified in a direction along the height of the cylinder of the vessel (B) (in a direction parallel to the in-plane direction of the raw material films). In this way, the films were heated up to a temperature of 3000° C., and thereby graphite films were manufactured. The angle formed between the straight line indicating a direction in which the raw material films were electrified and the normal direction with respect to the in-plane direction of the raw material films was 90°.

Example 18

Figure 21:
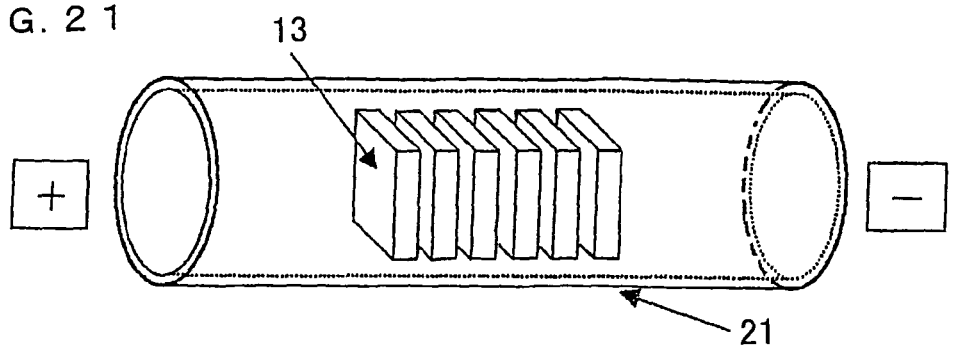
FIG. 21 is a schematic view illustrating how to hold the vessels (A) in the vessel (B).
Figure 22:
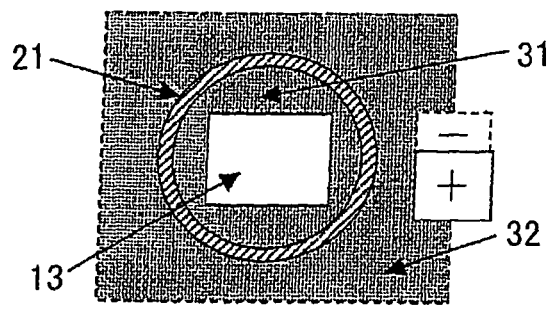
FIG. 22 illustrates how to hold the vessels (A) and vessel (B) and how in-plane directions of the raw material film and the direction of electrification are related with each other. Here, the straight line indication the direction of the electrification through the raw material film and the normal direction with respect to the plane of the raw material film make 0 degree. The vessels (A) are separated from the vessel (B).

As in Example 8, carbonized films A' obtained through carbonization (i.e., raw material films) were held in vessels (A) such that the in-plane direction of the raw material films became perpendicular to a direction along the height of the cylinder of the vessel (B), as shown in FIG. 21. Further, the outside of the vessel (A) was covered with carbon powder (the space between the vessels (A) and the vessel (B) was filled with carbon powder). The vessels (A) were held in the vessel (B) so as not to contact the vessel (B) as shown in FIG. 22. Then, the vessels (A) covered with the carbon powder as in Example 8 were electrified in a direction along the height of the cylinder of the vessel (B) (in a direction perpendicular to the in-plane direction of the raw material films). In this way, the films were heated up to a temperature of 3000° C., and thereby graphite films were manufactured. The angle formed between the straight line indicating a direction in which the raw material films were electrified and the normal direction with respect to in-plane direction of the raw material films was 0°.

Example 19

Figure 23:
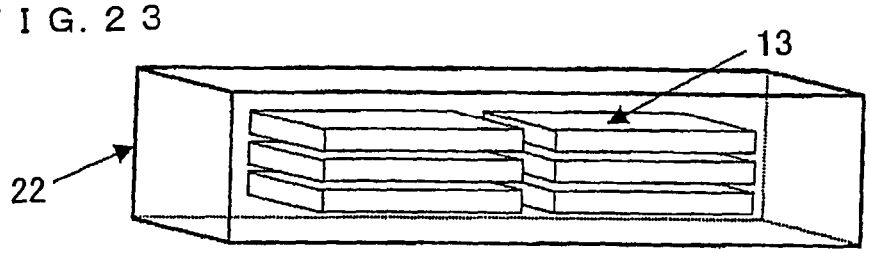
FIG. 23 is a schematic view illustrating how to hold the vessels (A) in the vessel (B).
Figure 24:
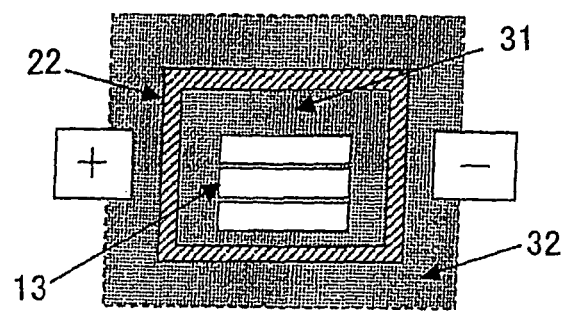
FIG. 24 illustrates how to hold the vessels (A) and vessel (B) and how in-plane directions of the raw material film and the direction of electrification are related with each other. Here, the straight line indication the direction of the electrification through the raw material film and the normal direction with respect to the plane of the raw material film make the right angle. The vessels (A) are separated from the vessel (B).

As in Example 8, carbonized films A' obtained through carbonization (i.e., raw material films) were held in the vessels (A), and the vessels (A) were held in the vessel (B) having the shape of a rectangular column as shown in FIG. 23. Further, the outside of the vessels (A) was covered with carbon powder (the space between the vessels (A) and the vessel (B) was filled with carbon powder), so that the vessels (A) did not contact the vessel (B). Then, the vessels (B) covered with the carbon powder as shown in FIG. 24 were electrified in the in-plane direction of the raw material films (in a direction parallel to a long side of the rectangular column (B)) by voltage application. In this way, the films were heated up to a temperature of 3000° C., and thereby graphite films were manufactured. The angle formed between the straight line indicating a direction in which the raw material films were electrified and the normal direction with respect to the in-plane direction of the raw material films was 90°.

Example 20

As in Example 8, carbonized films A' obtained through carbonization (polyimide films having a thickness of 225 μm) (i.e., raw material films) were held in the vessels (A), and the vessels (A) were held in the vessel (B). Further, the outside of the vessels (A) containing the raw material films were covered with carbon powder (the space between the vessels (A) and the vessel (B) was filled with carbon powder), so that the vessels (A) did not contact the vessel (B) as shown in FIG. 11. Then, the vessel (B) covered with the carbon powder as in Example 8 was electrified in a direction along the diameter of the vessel (B) (in a direction parallel to the in-plane direction of the raw material films). In this way, the films were heated up to a temperature of 3000° C., and graphite films were manufactured. The angle formed between the straight line indicating a direction in which the raw material films were electrified and the normal direction with respect to the in-plane direction of the raw material films was 90°.

Example 21

As in Example 8, carbonized films C' obtained through carbonization (polyimide films having a thickness of 225 μm) (i.e., raw material films) were held in the vessels (A), and the vessels (A) were held in the vessel (B). Further, the outside of the vessels (A) containing the raw material films were covered with carbon powder (the space between the vessels (A) and the vessel (B) was filled with carbon powder), so that the vessels (A) did not contact the vessel (B) as shown in FIG. 11. Then, the vessel (B) covered with the carbon powder as in Example 8 was electrified in a direction along the diameter of the vessel (B) (in a direction parallel to the in-plane direction of the raw material films). In this way, the films were heated up to a temperature of 3000° C., and graphite films were manufactured. The angle formed between the straight line indicating a direction in which the raw material films were electrified and the normal direction with respect to the in-plane direction of the raw material films was 90°.

Example 22

As in Example 8, the obtained polyimide films having a thickness of 75 μm (i.e., raw material films) were held in the vessels (A), and the vessels (A) were held in the vessel (B). Further, the outside of the vessels (A) containing the raw material films was covered with carbon powder that the vessels (A) did not contact the vessel (B) as shown in FIG. 11. Then, the vessel (B) covered with the carbon powder as in Example 8 was electrified in a direction along the diameter of the vessel (B) (in a direction parallel to the in-plane direction of the raw material films). In this way, the films were heated up to a temperature of 3000° C., and graphite films were manufactured. The angle formed between the straight line indicating a direction in which the raw material films were electrified and the normal direction with respect to in-plane direction of the raw material films was 90°.

Example 23

As in Example 8, carbonized films A' obtained through carbonization (polyimide films having a thickness of 75 μm) (i.e., raw material films) were held in the vessels (A), and the vessels (A) were held in the vessel (B). Further, the outside of the vessels (A) containing the raw material films was covered with carbon powder that the vessels (A) did not contact the vessel (B) as shown in FIG. 11. Then, the vessel (B), which is not covered with the carbon powder, was electrified in a direction along the diameter of the vessel (B) (in a direction parallel to the in-plane direction of the raw material films). In this way, the films were heated up to a temperature of 3000° C., and graphite films were manufactured. The angle formed between the straight line indicating a direction in which the raw material films were electrified and the normal direction with respect to in-plane direction of the raw material films was 90°.

Table 2 shows properties of the graphite films obtained in Examples 8 to 23 and in Comparative Example 1, such as thermal diffusivities, raw materials, thicknesses of the raw materials, how vessels (A) were set in the vessel (B), how voltages were applied, variations in thermal diffusivities, and the degree of uniformity of the surface condition of films. As used herein, the thicknesses of the raw materials were thicknesses of polymer films that were not carbonized yet.

Unevenness in the heat diffusivity in the in-plane direction shown in Table 2 is a difference (expressed in percentage) between a difference of maximum (MAX) and minimum (MIN) of heat diffusivities of an obtained graphite film and an average (MEAN) of all the graphite films. The unevenness in the heat diffusivity is expressed by the following equation: Unevenness=(MAX−MIN)/(MEAN)×100[%]. For examples, "<10%" in Table 2 indicates that the unevenness is less than 10%.

The surface conditions shown in Table 2 were classified by checking uniformity of the surface conditions visually and in terms of an amount of carbon powder dropped. Specifically, the surface conditions were classified into: "EX" (excellent) for films exhibiting excellent surface conditions; "G" (Good) for films exhibiting good surface conditions, and "NG" (not good) for films whose surface conditions were not so good.

Regarding the thermal diffusivities, all graphite films obtained in Examples 8 to 23 exhibited a high heat conductivity of not less than $8.0 \times 10^{-4}$ m$^2$/S, except the films obtained in Example 11.

Compared with the graphite films manufactured with application of heat under atmosphere in Comparative Example 1, the graphite films manufactured by electrifying the films to cause the films to generate heat in Examples 8 to 23 attained high thermal diffusivities in all aspects. Further, in Examples 20 and 21, even when raw materials had a thickness of 225 μm, graphite films having good surface conditions were manufactured by the method of the present invention, i.e., by the graphitization process including the step of electrifying the films to heat the films.

In Examples 8 to 23, raw material films were held in vessels capable of being directly electrified. Since the films were graphitized by applying voltage to the films through carbon powder, the films were electrified depending on how much the films were carbonized. This caused the raw material films themselves to generate heat, which facilitates heating the inside portion and surfaces of the film. Further, the film was sufficiently heated also from the surroundings of the films.

TABLE 2

Figure 14:
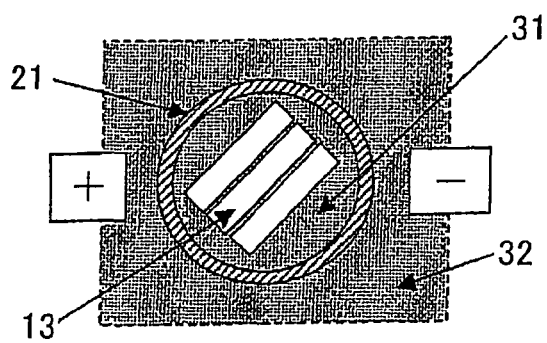
FIG. 14 illustrates how to hold the vessels (A) and vessel (B) and how in-plane directions of the raw material film and the direction of electrification are related with each other. Here, the straight line indication the direction of the electrification through the raw material film and the normal direction with respect to the plane of the raw material film make 45 degrees. The vessels (A) are separated from the vessel (B).

| | Raw material film (polymer film or carbonized film) Value in parentheses is a thickness of raw material (*1) | Size of raw material film (cm$^2$) | How to set the vessels (A) in vessel (B) | Shape of vessel (B) | Contact or non-contact between vessels (A) and vessel (B) | Direction for voltage application (electrification) | Angle (°) (*2) | Thickness of graphite film | Thermal diffusivities (×10$^{-4}$ m$^2$/S) | Variations in thermal diffusivity | Surface uniformity |
|---|---|---|---|---|---|---|---|---|---|---|---|
| Example 8 | A' (75 μm) | 100 | FIGS. 9, 10 | Cylinder | Non-contact | Direction along diameter of cylinder of vessel (B) | 90 | 34 μm | 8.6 | <10% | G |
| Example 9 | B' (75 μm) | 100 | | | | | | 33 μm | 8.8 | <10% | G |
| Example 10 | C' (75 μm) | 100 | | | | | | 31 μm | 9.0 | <10% | Ex |
| Example 11 | D' (75 μm) | 100 | | | | | | 40 μm | 6.6 | <10% | G |
| Example 12 | A' (75 μm) | 100 | FIGS. 9, 11 | | Contact | | | 36 μm | 8.4 | <15% | G |
| Example 13 | | 100 | FIGS. 9, 12 | | | | | 36 μm | 8.1 | <20% | NG |
| Example 14 | | 100 | FIGS. 9, 13 | | Non-contact | | 45 | 36 μm | 8.3 | <20% | G |
| Example 15 | | 100 | FIGS. 14, 15 | | | | 90 | 33 μm | 8.6 | <10% | G |
| Example 16 | | 100 | FIGS. 16, 17 | | | | 0 | 35 μm | 8.2 | <15% | G |
| Example 17 | | 100 | FIGS. 18, 19 | | | Direction along height of cylinder of vessel (B) | 90 | 35 μm | 8.4 | <15% | G |
| Example 18 | A' (75 μm) | 100 | FIGS. 20, 21 | Cylinder | Non-contact | Direction along height of cylinder of vessel (B) | 0 | 37 μm | 8.1 | <20% | G |
| Example 19 | | 100 | FIGS. 22, 23 | Rectangular column | | Direction parallel to long side of rectangular column of vessel (B) | 90 | 34 μm | 8.4 | <15% | G |
| Example 20 | A' (225 μm) | 100 | FIGS. 9, 10 | Cylinder | | Direction along diameter of cylinder of vessel (B) | | 110 μm | 8.4 | <20% | G |
| Example 21 | C' (225 μm) | 100 | FIGS. 9, 10 | | | | | 101 μm | 8.8 | <15% | G |
| Example 22 | A (75 μm) | 100 | FIGS. 9, 10 | | | | | 34 μm | 8.6 | <20% | G |
| Example 23 | A' (75 μm) | 100 | FIGS. 9, 10 | | | | | 34 μm | 8.4 | <10% | G |
| Comparative Example 1 | A' (75 μm) | 100 | | | Heating under atmosphere | | | 37 μm | 6.5 | <10% | G |

(*1) Thicknesses of raw materials indicate thicknesses of polyimide films before carbonization, i.e., thicknesses of films that were not carbonized yet.
(*2) Angle as used herein refers to an angle formed between normal line relative to in-plane direction of a raw material film and a line extending in a direction in which voltage was applied.

This is assumed to be a reason that the graphite films obtained in Examples 8 to 23 had more excellent electric and heat conductivity than conventional films.

The graphite films obtained in Examples 8 to 11 employing the same method for electrifying the films achieved excellent thermal diffusivities, which were greater in order of Examples 10, 9, 8, and 11. One reason why the films obtained in Example 10 exhibited the most excellent thermal diffusivity among the films obtained in Examples 8 to 11 lies in the method of manufacturing the starting material of the films. Specifically, since the starting films were manufactured by controlling the sequence of molecules in the material, the starting material had a high degree of plane orientation, which facilitates realignment of molecules during graphitization. Further, since the more highly the molecules of the starting material are aligned, the greater the carbon ratio is attained, it is considered that less decomposition gas was generated and the films were smoothly graphitized in Example 10. It is considered that, with the same reason, the films obtained in Example 21 were more excellent than the films obtained in Example 20.

Among the graphite films obtained in Examples 8, 12, and 13 employing the same starting material, the films obtained in Example 8 were the most excellent graphite films. The vessels (A) and the vessel (B) did not contact each other, while the vessels (A) contacted the vessel (B) in Example 12. Since the vessels (A) and the vessel (B) did not contact each other in Example 8, upon application of voltage, the vessels (A) were electrified uniformly through carbon powder covering the outside of the vessels (A), and the excellent graphite films were manufactured. On the contrary, in Example 12, when voltage was applied, the films were electrified (i) through carbon powder covering the outside of the vessels (A) and (ii) from a contact portion where the vessels (A) is in contact with the vessel (B), because the vessels (A) and vessel (B) are in contact with each other. Thus, in Example 12, the films were not electrified as uniform as in Example 8. This is guessed to be a reason that the excellent graphite films were manufactured in Example 8, in which the films were uniformly electrified. Further, in Example 13, the carbon powder was not filled around the vessels (A), and upon application of voltage, the films were electrified only from a contact portion where the vessels (A) contacted the vessel (B). This is considered to be a reason that, in Example 13, the films were not easily electrified as uniform as in Example 8. Further, compared with the films manufactured in Example 13, the more excellent graphite films were manufactured in Examples 8 and 12, in which the carbon powder was filled in the space between the vessels.

The graphite films obtained in Examples 8, 14, and 16 were excellent in thermal diffusivity, which were greater in this order. In Example 14, the angle formed between a straight line indicating a direction in which the raw material films were electrified and normal line relative to the in-plane direction of the raw material films was 45°. On the other hand, the angle was 0° in Example 16 and 90° in Example 8. Such differences in the angle are considered to be factors for achieving excellent graphite films. This is because it would be advantageous to electrify the films to heat the films uniformly in Example 8, in which the angle was 90°. It is considered that, with the same reason, the films obtained in Example 17 were more excellent in thermal diffusivity than those obtained in Example 18.

The reason why the films obtained in Example 8 were more excellent than those obtained in Example 17 is considered as follows. In Example 8, surfaces of the films were electrified in a direction along the diameter of the cylinder of the vessel (B).

On the contrary, in Example 17, surfaces of the films were electrified in a direction along the height of the vessel (B). Considering this, Example 8 is more advantageous in order to apply voltage to the films uniformly.

The reason why the films obtained in Example 8 were more excellent than those obtained in Example 19 as follows. The vessel (B) had the shape of a cylinder in Example 8, while the vessel (B) had the shape of a rectangular column in Example 19. When voltage was applied, the voltage was applied more uniformly to the cylinder than the rectangular column.

The reason why the films obtained in Example 8 were more excellent than those obtained in Example 23 is considered as follows. In Example 8, the vessel (B) was not directly electrified, but was electrified through carbon powder covering the vessel (B). This caused the films to be carbonized more uniformly in Example 8, and the graphite films having high quality were manufactured.

The reason why the films obtained in Example 10 were more excellent than those obtained in Example 21 with regard to uniformity of the surface conditions is considered to lie in the thickness of raw material films. Specifically, the raw material films used in Example 10 had a thickness being less than the thickness of raw material films used in Example 21. Thus, in Example 10, since the films were electrified to both the surfaces and inside portion of the film uniformly, the graphite films having excellent quality were achieved. Conventionally, no graphite film has been manufactured from a raw material film being 225 µm in thickness and not less than 25 cm$^2$, and having a heat diffusivity of $5\times10^{-4}$ m$^2$/S or more and an in-plane thermal diffusivity being within the range of 40%. Thus, the graphite films of the present invention are extremely excellent than those obtained by conventional techniques.

In all Examples, graphite films were manufactured which had thermal diffusivities being within the range of 20%. This is considered due to the following factors: (i) raw material films were heated uniformly with electrification by application of voltage; and (ii) the electrification was carried out with voltage application in which significant localization of the applied voltage is not occurred due to the shape of vessels.

In Example 10, by electrifying and heating the films, graphite films were obtained that had extremely uniform surface conditions. It is considered that such graphite films were achieved due to the following factors: (i) orientation of the raw material films was high; (ii) the vessels (A) did not contact the vessel (B); and (iii) the angle formed between a straight line indicating a direction in which the raw material films were electrified and normal line relative to the in-plane direction of the raw material films was 90°.

The invention claimed is:

1. A method for producing a graphite film by graphitizing a raw material film, which is a polymer film and/or a polymer film that is carbonized, the method comprising:
   holding the raw material film in a vessel that is capable of being electrified by voltage application and generating heat by electrification; and
   graphitizing the raw material film in the vessel by applying a voltage on the vessel so as to electrify and heat the vessel and to electrify the raw material film with the vessel so that the raw material film is heated.

2. The method as set forth in claim 1, wherein:
   the raw material film is an insulator in an initial stage of a process of producing the graphite film.

3. The method as set forth in claim 1 wherein:
   the vessel is made of graphite.

4. The method as set forth in claim 3, wherein:
the electrification is carried out in such a manner that carbon powder is filled in a gap between the vessel made of graphite and the raw material film, and/or around the vessel.

5. A method for producing a graphite film by graphitizing a raw material film, which is a polymer film and/or a polymer film that is carbonized, the method comprising:
holding the raw material film in a vessel (A) capable of being electrified which generates heat by electrification;
holding the vessel (A) in a vessel (B) capable of being electrified; and
graphitizing the raw material film by electrifying the raw material film through electrification and heating of the vessel (B) and the vessel (A) to heat the raw material film.

6. The method as set forth in claim 5, wherein:
the electrification is carried out in such a manner that carbon powder is provided around the vessel (A).

7. The method as set forth in claim 5, wherein:
the electrification is carried out in such a manner that carbon powder is provided between the vessels (A) and (B).

8. The method as set forth in claim 5, wherein:
the vessels (A) and (B) are separated from each other.

9. The method as set forth in claim 5, wherein:
the vessel (B) has a cylinder shape.

10. The method as set forth in claim 5, wherein:
the raw material film is electrified in a straight line direction from a positive electrode to a negative electrode, the straight line direction being at an angle of 60 degrees or more and 120 degrees or less with respect to a normal line of a direction of the surface of the raw material film.

11. The method as set forth in claim 5, wherein:
the vessel (A) and/or the vessel (B) is made of graphite.

12. The method as set forth in claim 5, wherein:
the raw material film is an insulator in an initial stage of a process of producing the graphite film.

13. The method as set forth in claim 1, wherein:
the polymer film is made of at least one polymer selected from the group consisting of polyimide, polyimide, polyoxadiazole, polybenzothiazole, polybenzobisthiazole, polybenzoxazole, polybenzbisoxazole, polyparaphenylenevinylene, polybenzimidazole, polybenzbisimidazole, and polythiazole.

14. The method as set forth in claim 5, wherein:
the polymer film is made of at least one polymer selected from the group consisting of polyimide, polyimide, polyoxadiazole, polybenzothiazole, polybenzobisthiazole, polybenzoxazole, polybenzbisoxazole, polyparaphenylenevinylene, polybenzimidazole, polybenzbisimidazole, and polythiazole.

15. The method as set forth in claim 13, wherein:
the polymer film is a polyimide film having a birefringence of 0.08 or more.

16. The method as set forth in claim 14, wherein:
the polymer film is a polyimide film having a birefringence of 0.08 or more.

17. The method as set forth in claim 13, wherein:
the polymer film is a polyimide film having a birefringence of 0.12 or more.

18. The method as set forth in claim 14, wherein:
the polymer film is a polyimide film having a birefringence of 0.12 or more.

19. The method as set forth in claim 13, wherein:
preparation of the polyimide film includes imidating a polyimide acid containing pyromellitic dianhydride and p-phenylene diamine by using a dehydrator and an imidation promoter.

20. The method as set forth in claim 14, wherein:
preparation of the polyimide film includes imidating a polyimide acid containing pyromellitic dianhydride and p-phenylene diamine by using a dehydrator and an imidation promoter.

21. The method as set forth in claim 13, wherein:
preparation of the polyimide film includes:
synthesizing a prepolymer from a diamine and an acid dianhydride, the prepolymer having the acid dianhydride on each terminal;
reacting the prepolymer with another diamine so as to synthesize a polyimide acid; and
imidating the polyimide.

22. The method as set forth in claim 14, wherein:
preparation of the polyimide film includes: synthesizing a prepolymer from a diamine and an acid dianhydride, the prepolymer having the acid dianhydride on each terminal;
reacting the prepolymer with another diamine so as to synthesize a polyimide acid; and
imidating the polyimide.

23. The method as set forth in claim 5, wherein:
a number of the vessel (A), which is held in the vessel (B), is plural.

* * * * *